(12) United States Patent
Kamijo

(10) Patent No.: US 6,819,532 B2
(45) Date of Patent: Nov. 16, 2004

(54) MAGNETORESISTANCE EFFECT DEVICE EXCHANGE COUPLING FILM INCLUDING A DISORDERED ANTIFERROMAGNETIC LAYER, AN FCC EXCHANGE COUPLING GIVING LAYER, AND A BCC EXCHANGE COUPLING ENHANCEMENT LAYER

(75) Inventor: Atsushi Kamijo, Tokyo (JP)

(73) Assignee: NEC Corporation (JP)

( * ) Notice: Subject to any disclaimer, the term of this patent is extended or adjusted under 35 U.S.C. 154(b) by 225 days.

(21) Appl. No.: 10/255,847

(22) Filed: Sep. 26, 2002

(65) Prior Publication Data

US 2003/0128483 A1 Jul. 10, 2003

(30) Foreign Application Priority Data

Oct. 12, 2001 (JP) ......................................... 2001-316100

(51) Int. Cl.⁷ .................................................. G11B 5/39
(52) U.S. Cl. ................................. 360/324.11; 360/324.2
(58) Field of Search ......................... 360/324.1, 324.11, 360/324.12, 324.2

(56) References Cited

U.S. PATENT DOCUMENTS

| | | | |
|---|---|---|---|
| 5,465,185 A | 11/1995 | Heim et al. ............ | 360/324.11 |
| 5,976,713 A | * 11/1999 | Fuke et al. ................. | 428/692 |
| 6,210,818 B1 | * 4/2001 | Saito ......................... | 428/692 |
| 6,395,388 B1 | * 5/2002 | Iwasaki et al. ............. | 428/332 |
| 2002/0051380 A1 | * 5/2002 | Kamiguchi et al. ......... | 365/158 |
| 2003/0035255 A1 | * 2/2003 | Hasegawa et al. ..... | 360/324.11 |
| 2003/0099868 A1 | * 5/2003 | Tanahashi et al. ... | 428/694 TM |
| 2004/0048104 A1 | * 3/2004 | Shimazawa et al. ........ | 428/693 |

FOREIGN PATENT DOCUMENTS

| JP | 6-060336 | 3/1994 |
|---|---|---|
| JP | 9-063021 | 3/1997 |
| JP | 9-081915 | 3/1997 |
| JP | 9-147325 | 6/1997 |
| JP | 9-148132 | 6/1997 |
| JP | 10-154311 | 6/1998 |
| JP | 10-188229 | 7/1998 |
| JP | 10-208215 | 8/1998 |
| JP | 10-275723 | 10/1998 |
| JP | 10-284321 | 10/1998 |
| JP | 2850866 | 11/1998 |
| JP | 11-111522 | 4/1999 |
| JP | 11-175919 | 7/1999 |
| JP | 11-191647 | 7/1999 |
| JP | 11-232617 | 8/1999 |
| JP | 2000-022239 | 1/2000 |
| JP | 2000-068569 | 3/2000 |
| JP | 2000-132814 | 5/2000 |
| JP | 2000-251226 | 9/2000 |
| JP | 2000-268330 | 9/2000 |
| JP | 2000-315305 | 11/2000 |
| JP | 2001-068757 | 3/2001 |
| JP | 2001-102215 | 4/2001 |
| JP | 2002/74626 A | * 3/2002 |

OTHER PUBLICATIONS

K. Yagami, et al., "Enhancement of $H_{ex}$ in Mn–Ir/Co–Fe Exchange–Coupled Films By Controlling Seed Layers", *Proceedings of the 24$^{th}$ Annual Conference (2000)*, The Magnetics Society of Japan", p. 409.

* cited by examiner

*Primary Examiner*—Jefferson Evans
(74) *Attorney, Agent, or Firm*—Ostrolenk, Faber, Gerb & Soffen, LLP

(57) ABSTRACT

A foundation layer increasing adhesive properties to a substrate, another foundation layer controlling orientation of an antiferromagnetic layer, the antiferromagnetic layer including a disordered alloy of IrMn, a pinning layer, and a cap protection layer are formed in the order on the substrate. The pinning layer includes two layers having an exchange coupling giving layer which exchange-couples to the antiferromagnetic layer and an exchange coupling enhancement layer which enhances the exchange coupling, the exchange coupling giving layer is made of a ferromagnetic material including Co or a $Co_{100-X}Fe_X$ alloy ($0 \leq X < 25$) having face-centered cubic structure. The exchange coupling enhancement layer is made of Fe or a $Co_{100-Y}Fe_Y$ alloy ($25 \leq Y \leq 100$) having body-centered cubic structure.

14 Claims, 8 Drawing Sheets

MAGNETORESISTANCE EFFECT DEVICE EXCHANGE COUPLING FILM INCLUDING A DISORDERED ANTIFERROMAGNETIC LAYER, AN FCC EXCHANGE COUPLING GIVING LAYER, AND A BCC EXCHANGE COUPLING ENHANCEMENT LAYER

BACKGROUND OF THE INVENTION

1. Field of the Invention

The present invention relates to an exchange coupling film utilizing exchange coupling which acts between a ferromagnetic layer and an antiferromagnetic layer, a magneto-resistance effect device having the exchange coupling film, and a reproducing magnetic head and a magnetic random access memory which use the magneto-resistance effect device.

2. Description of the Related Art

A so-called spin valve type of magneto-resistance effect device is used for a magnetic random access memory (MRAM) which is notable as a reproducing magnetic head and a nonvolatile memory of a hard disk drive (HDD) apparatus corresponding to high magnetic recording density. A basic structure of the spin valve type of magneto-resistance effect device is a multilayer in which a ferromagnetic layer, a nonmagnetic material layer, the ferromagnetic layer, and an antiferromagnetic layer are formed in the order or in reverse. At this point, a magnetic moment of the ferromagnetic layer adjoining the antiferromagnetic layer is fixed by exchange coupling (it is also referred to as exchange bias) which acts between the antiferromagnetic layer and the ferromagnetic layer adjoining the antiferromagnetic layer so as not to rotate the magnetic moment to an external magnetic field, so that the ferromagnetic layer is referred to as a fixing layer or a pinning layer. Generally a multilayered film including the ferromagnetic layer and the antiferromagnetic layer is referred to as an exchange coupling film or an exchange bias film. The magnetic moment of the other ferromagnetic layer isolated from the pinning layer through the nonmagnetic material layer can be rotate responsive to the external magnetic field, so that the ferromagnetic layer is referred to as a free layer.

The spin valve type of magneto-resistance effect device is divided into two kinds by difference in the nonmagnetic material layer: (1) A giant magneto-resistance effect (GMR) device in which the nonmagnetic material layer includes nonmagnetic metal such as Cu and (2) A tunnel magneto-resistance effect (TMR) device in which the nonmagnetic material layer includes an insulating layer (tunnel barrier layer) such as aluminum oxide ($AlO_x$). The TMR device is also referred to as a ferromagnetic tunnel junction device. In any of the devices, by utilizing a phenomenon that a relative angle defined by the magnetic moment of the free layer and that of the pinning layer changes as conductance of the device changes, information of a magnetic recording medium is read in case of a reproducing magnetic head of the HDD apparatus and information of stored bits is read in case of the MRAM. With respect to write, the magnetic moment of a recording bit in the magnetic recording medium is reversed by using a fringing field from a recording magnetic head in case of the HDD apparatus, the magnetic moment of the free layer in the device is reversed by a resultant magnetic field which current flown through a bit line and a word line forms in case of the MRAM.

The conductance of the device is dependent on cos θ, where an angle defined by the magnetic moment of the free layer and that of the pinning layer is θ, the conductance becomes a maximum in case that the both magnetic moments are parallel to each other (θ=0°), the conductance becomes a minimum in case that the both magnetic moments are antiparallel to each other (θ=180°).

In the GMR device and the TMR device, the GMR device differs completely from the TMR device in physical origin, however it is the same to utilize an effect that the conductance of the device changes corresponding to a change in the relative angle (θ) of the magnetic moments of the both magnetic layers, namely the magneto-resistance effect. That is to say, magnetic resistance of the GMR device is derived from a difference in scattering length between an electron having spin-up and an electron having spin-down depending on the angle defined by the magnetic moment of the free layer and that of the pinning layer, on the other hand, the magnetic resistance of the TMR device is derived from a difference in tunnel probability between an electron having spin-up and an electron having spin-down depending on the angle.

FIG. 1 is a graph showing hysteresis curves of dependence of magnetization of the spin valve type of magneto-resistance effect device on a magnetic field (M-H curve) and dependence of resistance (inverse number of the conductance) on the magnetic field (R-H curve), where transverse axes are magnetic field strength and longitudinal axes are the magnetization and the resistance. The sharp hysteresis near the zero magnetic field corresponds to a magnetic rotation of the free layer, and the hysteresis appeared in the high magnetic field corresponds to the magnetic rotation of the pinning layer. The shift in the hysteresis of the pinning layer is derived from the exchange coupling (it is also referred to as the exchange bias) acting an interlayer between the pinning layer (ferromagnetic layer) and the antiferromagnetic layer adjoining the pinning layer (hereinafter referred to as ferromagnetic-layer/antiferromagnetic-layer interlayer), shift quantity $H_{ex}$ of the hysteresis of the pinning layer from the zero magnetic field is referred to as an exchange coupling magnetic field (it is also referred to as exchange bias magnetic field). A magnetization direction of the free layer is antiparallel to the magnetization direction of the pinning layer within an area between the hysteresis of the free layer and that of the pinning layer, the resistance of the device becomes larger and the conductance of the device becomes smaller within the area.

In the both spin valve type of magneto-resistance effect devices of the GMR and the TMR, it is necessary that the magnetic moment of the pinning layer is fixed in one direction for stable operation of the device, and it is necessary that the strong exchange coupling in the ferromagnetic-layer/antiferromagnetic-layer interlayer is generated and the hysteresis of the free layer is sufficiently separated from the hysteresis of the pinning layer, namely the area where the magnetic moment of the free layer is antiparallel to that of the pinning layer is extended. For the purpose, the exchange coupling magnetic field $H_{ex}$ must be increased while expansion of the hysteresis of the pinning layer, namely coercive force $H_{cp}$ shown in FIG. 1 is decreased.

The exchange coupling energy J acting the ferromagnetic-layer/antiferromagnetic-layer interlayer is given as follows:

$$J = H_{ex} \times M_s \times t \quad \text{(FORMULA 1)}$$

where the exchange coupling magnetic field is $H_{ex}$, saturation magnetization of the ferromagnetic layer is $M_s$, and a film thickness of the ferromagnetic layer is t.

It is generally recognized that the exchange coupling energy J is decided by a combination of the antiferromagnetic material and the ferromagnetic material. As shown obviously in the formula 1, the exchange coupling magnetic field $H_{ex}$ increases as the film thickness of the ferromagnetic layer t decreases when the exchange coupling energy J is constant. However the exchange coupling magnetic field $H_{ex}$ may be increased seemingly by decreasing film thickness of the pinning layer, it is limited that the exchange coupling magnetic field $H_{ex}$ is increased only by decreasing film thickness of the pinning layer because the coercive force $H_{cp}$ is tend to increase with decreasing film thickness of the ferromagnetic layer t. When an oxide material typified by NiO or an ordered alloy typified by PtMn is used as the antiferromagnetic material, the coercive force of the pinning layer becomes larger than the exchange coupling magnetic field $H_{ex}$, which causes a problem in device operation. Accordingly, in order to increase the exchange coupling magnetic field $H_{ex}$, it is necessary that firstly the exchange coupling energy is increased, secondly the film thickness of the pinning layer is decreased within a range where operation of the magneto-resistance device is not damaged, and thirdly the coercive force of the hysteresis of the pinning layer is decreased within a range where the exchange coupling magnetic field is not largely decreased. For this reason, various materials and multilayered configurations have been proposed as described below in detail.

A disordered alloy type of antiferromagnetic material having face-centered cubic structure typified by IrMn and an ordered alloy type of antiferromagnetic material of a CuAu—I type ($L1_0$ type) having face-centered tetragonal structure typified by PtMn are known as the antiferromagnetic material having high resistance to a manufacturing process of the magnetic head and the MRAM and the large exchange coupling energy. For example, an exchange coupling film utilizing the antiferromagnetic material made of an IrMn alloy and a magneto-resistance effect device using the exchange coupling film are disclosed in Japanese Patent Application Laid-Open No. 148132/1997 and Japanese Patent Application Laid-Open No. 2001-102215. Magneto-resistance effect devices having the pinning layer of the exchange coupling film utilizing the ordered alloy type of antiferromagnetic material made of PdMn and PtMn are disclosed in Japanese Patent Application Laid-Open No. 81915/1997 and Japanese Patent Application Laid-Open No. 147325/1997 respectively. Another magneto-resistance effect device having the pinning layer of the exchange coupling film utilizing the ordered alloy type of antiferromagnetic material made of PdPtMnCr is disclosed in Japanese Patent Application Laid-Open No. 2000-251226. Furthermore, magneto-resistance effect devices having the pinning layer of the exchange coupling film utilizing the ordered alloy type of antiferromagnetic material made of NiMn are disclosed in Japanese Patent Application Laid-Open No. 60336/1994 and Japanese Patent Application Laid-Open No. 63021/1997.

A technique that the exchange coupling is increased by building up the antiferromagnetic layers has been also developed. For example, a spin valve type of magneto-resistance sensor having the exchange coupling film formed by building up a plurality of antiferromagnetic layers with variation of elements or composition of an alloy is disclosed in Japanese Patent Application Laid-Open No. 2000-132814. A magneto-resistance effect device having the exchange coupling film formed by multilayered films of a disordered alloy type of antiferromagnetic layer and an ordered alloy type of antiferromagnetic layer is disclosed in Japanese Patent Application Laid-Open No. 175919/1999. An exchange coupling film, in which the antiferromagnetic layer is consisted of two portions, namely the portion near the pinning layer is mainly consisted of a γ-Mn phase and the other portion is mainly consisted of an α-Mn phase, is disclosed in Japanese Patent Application Laid-Open No. 111522/1999.

A technique that the exchange coupling is increased by controlling a crystal orientation of the antiferromagnetic layer has been also disclosed. For example, an exchange coupling film, in which the large exchange coupling is obtained by improving the crystal orientation of an IrMn layer in such a manner as to form a controlling layer of the crystal orientation, a controlling layer of crystal structure, and a lattice controlling layer beneath the IrMn layer, is disclosed in Japanese Patent Application Laid-Open No. 208215/1998. Another exchange coupling film characterized in that the antiferromagnetic layer of the CuAu—I type of ordered alloy is formed on a promoting layer for antiferromagnetism and the antiferromagnetic layer has the (110) orientation is disclosed in Japanese Patent Application Laid-Open No. 2000-22239. Another exchange coupling film having the antiferromagnetic layer of epitaxial grown NiMn is disclosed in Japanese Patent Application Laid-Open No. 275723/1998.

A technique that the large exchange coupling is given by controlling grain structure of the antiferromagnetic layer or interfacial structure of the antiferromagnetic layer and the ferromagnetic layer has been also known. For example, an exchange coupling film, which has an average grain diameter of the antiferromagnetic layer not smaller than 5 nm and the uniform crystal orientation of the surface in such a manner as to form by using an alloy target having oxygen content of not more than 1 wt %, is disclosed in Japanese Patent Application Laid-Open No. 284321/1998. Another exchange coupling film having the antiferromagnetic layer, in which a full width at half maximum of a rocking curve of a (111) peak by X-ray diffraction is not more than 100 and the average grain diameter is in a range from 3 to 50 nm, is disclosed in Japanese Patent Application Laid-Open No. 2000-68569. Another exchange coupling film characterized in that the interfacial structure of the ordered alloy type of antiferromagnetic layer and the ferromagnetic layer is a disconformable state, namely the ferromagnetic layer is (111) orientation and the antiferromagnetic layer is not oriented, is disclosed in Japanese Patent Application Laid-Open No. 191647/1999.

Furthermore, however the orientation of the antiferromagnetic layer is not always increased, in a exchange coupling film having laminated structure of substrate layer (seed layer), antiferromagnetic layer, and ferromagnetic layer (pinning layer), it is known that the exchange coupling energy and the exchange coupling magnetic field vary by a kind and a thickness of the substrate layer (seed layer).

In case that a multilayer film is built up in the order of a layer made of a component X and having a film thickness of x nm, a layer made of a component Y and having a film thickness of y nm, and a layer made of a component Z and having a film thickness of z nm, the multilayer film is represented as "X layer (x nm)/Y layer (y nm)/Z layer (z nm)". Each of x, y, and z is a numeral showing a film thickness. Further, in case that the film thickness is not specified, the multilayer film is represented as "X layer/Y layer/Z layer".

In the Proceedings of the 24th Annual Conference (2000) page 409 of "The Magnetics Society of Japan", in a GMR film provided with a configuration of Ta layer (5 nm)/seed layer (appropriate thickness)/IrMn layer (6.8 nm)/CoFe layer (2 nm)/Cu layer (2.5 nm)/CoFe layer (2 nm)/capping layer (appropriate thickness), which formed on the substrate, the exchange coupling magnetic field $H_{ex}$ is 1030 Oe in case that the seed layer is a Cu layer (1 nm), the exchange coupling magnetic field $H_{ex}$ is 1270 Oe in case that the seed layer is a double layer of NiFe layer (1 nm)/Cu layer (1 nm), and the exchange coupling magnetic field $H_{ex}$ is 1290 Oe in case that the seed layer is a double layer of CoFe layer (1 nm)/Cu layer (1 nm). When these values of the exchange coupling magnetic field $H_{ex}$ are converted into the exchange coupling energy, the converted values are approximately equal to the value (exchange coupling energy $J=0.36\times10^{-7} J/cm^3$) of the film made of the ordered alloy type of antiferromagnetic layer.

The above-described techniques are based on a method that the exchange coupling is increased by controlling a thin film structure (crystal orientation and grain structure) of the antiferromagnetic layer. On the other hand, since the exchange coupling acts the interface between the antiferromagnetic layer and the ferromagnetic layer, there is another technique that the exchange coupling is increased by focusing on the interfacial in a manner that an interface control layer is provided between the antiferromagnetic layer and the ferromagnetic layer to increase coherence of the interface between the antiferromagnetic layer and the ferromagnetic layer.

For example, there is a technique that the exchange coupling is increased in a manner that the interface control layer being coherent to both crystal lattices of the antiferromagnetic layer and the ferromagnetic layer is provided between the antiferromagnetic layer and the ferromagnetic layer to secure crystalline structure of the both layers. An exchange coupling film having a plasma treatment layer in which several atomic layers in at least one of a surface of the ferromagnetic layer (pinning layer) and an initial growth layer of the antiferromagnetic layer is treated by plasma treatment of an argon ion is disclosed in Japanese Patent Application Laid-Open No. 2000-268330.

There is also an interface control layer whose purpose of formation is increment of separation of the hysteresis of the free layer in the spin valve type of magneto-resistance effect device from the hysteresis of the pinning layer by reducing the coercive force of the hysteresis of the pinning layer without influence on the exchange coupling magnetic field rather than increment of the exchange coupling. However there is a problem that the coercive force of the pinning layer is large and an area where the magnetic moment of the free layer is antiparallel to the magnetic moment of the pinning layer is narrow, a technique which reduces the coercive force of the pinning layer by inserting the interface control layer made of the nonmagnetic metal or the oxide material including Cr or Mn with the film thickness of 0.3 to 2 nm between the antiferromagnetic layer of NiO and the pinning layer (ferromagnetic layer) is described in Japanese Patent No. 2850866.

Especially, in the exchange coupling film made of the antiferromagnetic layer of the ordered alloy, though the exchange coupling magnetic field is relatively large, the coercive force of the pinning layer becomes considerably large, which causes the hysteresis of the free layer and the hysteresis of the pinning layer to be separated insufficiently in case of the spin valve type of magneto-resistance effect device. As a result, there is a problem that good device operation can not be realized. In such cases, it is necessary that the coercive force of the pinning layer is reduced within a range where the exchange coupling magnetic field is not extremely reduced. From a view point of the reduction of the coercive force of the pinning layer, it is known that a multilayered pinning layer is effective. Concretely the pinning layer is constituted by not lower than two ferromagnetic layers, the exchange coupling of the antiferromagnetic layer is shared by the ferromagnetic layer being contact with the antiferromagnetic layer, the low coercive force or a role except the exchange coupling such as resistance to heat treatment is shared by the ferromagnetic layer except the ferromagnetic layer being contact with the antiferromagnetic layer. Accordingly, it is found that the relatively large exchange coupling magnetic field and the small coercive force of the pinning layer can be compatible by the multilayered pinning layer, however it is difficult to achieve in the single pinning layer.

For example, it is described in Japanese Patent Application Laid-Open No. 2000-315305 that, in a spin valve sensor utilizing the exchange coupling film consisted of the antiferromagnetic layer and the pinning layer of the antiferromagnetic coupling (AFC) film of CoFe layer/Ru layer/CoFe layer/Ru layer/CoFe layer, the coercive force of the AFC film can be small by providing a double-layered interlayer made of CoFe and NiFe between the antiferromagnetic layer and the AFC film. The pinning layer utilizing the AFC film can obtain the larger exchange coupling magnetic field compared with the single pinning layer. This is because a first ferromagnetic layer of the AFC film is combined antiferromagnetically with a second ferromagnetic layer of the AFC film through a spacer layer such as Ru, which causes the magnetic moment of the whole AFC film to be equal to a difference between the magnetic moment of the first ferromagnetic material and the magnetic moment of the second ferromagnetic material. That is to say, the magnetic moment of the whole AFC film is smaller than that of the single ferromagnetic layer and the exchange coupling magnetic field $H_{ex}$ is inversely relate to the saturation magnetization Ms according to the formula 1, which allows the exchange coupling magnetic field of the AFC film to be increased. The spin valve sensor utilizing the AFC film as the pinning layer is described in U.S. Pat. No. 5,465,185.

There are particularly two problems of manufacturing as described below for using the AFC film as the pinning layer, however the above-described AFC film has an advantage of being capable of increasing the exchange coupling magnetic field. The first problem is that sufficiently large antiferromagnetic coupling needs to act between two magnetic material layers, so that the film thickness of the spacer layer requires strict control. The second problem is that, as described in Japanese Patent Application Laid-Open No. 2000-315305, it is necessary to form the pinning layer by the AFC film and another ferromagnetic layer in order to reduce the coercive force of the AFC film, which results in increment of the number of necessary targets forming the AFC film and enlargement of a manufacturing apparatus. From a view point of manufacturing cost of film formation, it is desirable that the AFC film is not used for the pinning layer as much as possible.

It is disclosed in Japanese Patent Application Laid-Open No. 232617/1999 that, in a spin valve type of magneto-resistance effect device having a configuration of first ferromagnetic layer (free layer)/nonmagnetic layer/second ferromagnetic layer (pinning layer)/antiferromagnetic layer, the second ferromagnetic layer (pinning layer) is a multilayer consisted of at least two ferromagnetic layers, the ferromagnetic layer of a side being in contact with the antiferromagnetic layer obtains the high exchange coupling energy at an interface between the antiferromagnetic layer and the ferromagnetic layer, and the ferromagnetic material has the small saturation magnetization in the ferromagnetic layer of a side being out of contact with the antiferromagnetic layer. It is described that the high exchange coupling magnetic field can be compatible with the small coercive force of the pinning layer by the pinning layer such as the configuration. It is also described that thermal stability is obtained in a manner that a ferromagnetic material being difficult to diffuse mutually into the nonmagnetic layer is used as the ferromagnetic material of the side being in contact with the nonmagnetic layer. In this technique, a material consisted of the ferromagnetic layer being contact with the antiferromagnetic layer depends on the antiferromagnetic material. For example, it is disclosed that, in case of the antiferromagnetic material of the ordered alloy represented by PtMn, the antiferromagnetic layer is formed by Co or CoFe alloy having the film thickness of at least 0.5 nm and NiFe is suitable for the ferromagnetic material having the small saturation magnetization.

However, in the technique disclosed in Japanese Patent Application Laid-Open No. 232617/1999, the second ferromagnetic layer (pinning layer) is consisted of at least two ferromagnetic layers, one of the two layers uses the ferromagnetic layer obtaining the large exchange coupling energy, and the other layer uses the ferromagnetic layer having the small saturation magnetization, when at least two ferromagnetic layers are deposited, the obtained characteristics as a whole become average characteristics of each layer, which causes remarkable performance not to be obtained.

An exchange coupling film consisted of the antiferromagnetic layer of an IrMn alloy and the ferromagnetic layer (pinning layer), in which the ferromagnetic layer (pinning layer) has multilayered structure of a Co or Co alloy layer and a NiFe alloy layer, the IrMn alloy layer is in contact with the Co or Co alloy layer, and a proportion of the thickness of the Co or Co alloy layer is 10 to 40% of the whole thickness of the pinning layer, is disclosed in Japanese Patent Application Laid-Open No. 188229/1998.

In the GMR device having the pinning layer of the multilayered structure consisted of two ferromagnetic layers, there is a case that the ferromagnetic layer of the nonmagnetic layer side has function as an MR enhanced layer in order not to increase the exchange coupling magnetic field or reduce the coercive force of the pinning layer, but in order to increase the magneto-resistance effect namely increase a ratio of change of the magneto-resistance. For example, it is disclosed in Japanese Patent Application Laid-Open No. 154311/1998 that a GMR device comprises the ferromagnetic layer being in contact with the antiferromagnetic layer using a crystalline ferromagnetic layer of a single metal, an alloy or a multilayered film made of Fe, Ni and/or Co and the MR enhanced ferromagnetic layer of the nonmagnetic layer side using an amorphous ferromagnetic layer such as CoFeB.

There is also multilayer structure consisted of at least two pinning layers of the ferromagnetic layer in order to improve resistance to heat treatment. In a ferromagnetic tunnel junction (TMR) device disclosed in Japanese Patent Application Laid-Open No. 2001-68757, the antiferromagnetic layer is made of a manganese ordered alloy, the ferromagnetic layer exchange-biased by the antiferromagnetic layer is constituted by the multilayer film of at least two layers, the ferromagnetic layer being in contact with the antiferromagnetic layer is made of a single cobalt metal, a cobalt alloy, or a cobalt compound, and the ferromagnetic layer being in contact with a tunnel barrier is made of a single nickel metal, a nickel alloy, or a nickel compound. This permits deterioration of device characteristics by heat treatment to be suppressed, even though the heat treatment which is needed during formation of the antiferromagnetic layer by the manganese ordered alloy is performed for hours at a higher temperature.

As described above, in the spin valve type of magneto-resistance effect device, the larger exchange coupling magnetic field and the exchange coupling film giving the smaller coercive force of the pinning layer are always required so as to improve operating stability and reliability of the device. Various techniques have been proposed in order to increase the exchange coupling magnetic field which acts between the pinning layer of the ferromagnetic layer and the antiferromagnetic layer and to reduce the coercive force of the pinning layer of the ferromagnetic layer.

The first technique is a method such that the exchange coupling is increased by controlling composition, a kind, or crystal structure of component elements constituting the antiferromagnetic layer. The techniques include a method controlling the thin film structure of the antiferromagnetic layer, namely the orientation and the crystal grain structure of the antiferromagnetic layer. Alloys including a platinum group (Pt, Pd, Ir, and Rh) and Mn are mainly used as the antiferromagnetic material having the chemical and thermal resistance to a manufacturing process of the magnetic head and MRAM and being capable of giving the exchange coupling magnetic field to at least a certain extent. Typically, it is an IrMn disordered alloy or a PtMn ordered alloy.

The second technique is a method such that, focusing on the interface between the ferromagnetic layer of the pinning layer and the antiferromagnetic layer, the exchange coupling is increased by providing the interface control layer between the ferromagnetic layer and the antiferromagnetic layer.

The third technique is a method such that the coercive force of the pinning layer is reduced without reducing the exchange coupling magnetic field remarkably in a manner that one of the ferromagnetic layer being in contact with the antiferromagnetic material has function of the exchange coupling with the antiferromagnetic material and the other ferromagnetic layer has function of the low coercive force with the ferromagnetic layer of the pinning layer as the multilayer structure including at least two ferromagnetic layer.

However, there are problems described below in the above described conventional techniques. It is difficult that the larger exchange coupling magnetic field and the smaller coercive force of the pinning layer are simultaneously achieved even in the exchange coupling film using the antiferromagnetic layer as described above. The coercive force of the pinning layer is small but the exchange coupling magnetic field is small in case of the exchange coupling film using the antiferromagnetic layer of the disordered alloy. On the other hand, the exchange coupling magnetic field is large but the coercive force of the pinning layer is also large considerably in case of the exchange coupling film using the antiferromagnetic layer of the ordered alloy. Accordingly, in order to improve the operating stability and the reliability of the spin valve type of magneto-resistance effect device used for the magnetic head and the MRAM, it is necessary that the exchange coupling field increases the exchange coupling magnetic field for the exchange coupling film using the antiferromagnetic layer of the disordered alloy and the exchange coupling film reduces the coercive force of the pinning layer for the exchange coupling film using the antiferromagnetic layer of the ordered alloy.

In the method that the ferromagnetic layer of the pinning layer is formed by at least two ferromagnetic layers, when the antiferromagnetic layer is made of the antiferromagnetic material including the ordered alloy of the $L1_0$ type (CuAu—I type) of face-centered cubic structure such as a PtMn alloy, a PdMn alloy, and a NiMn alloy, there is a problem which effect of the double-layered film is small, because it is not possible to reduce the coercive force of the pinning layer by the multilayered film of the pinning layer even though the exchange coupling energy can be increased somewhat compared with the single layer film of the pinning layer. As described above, sufficient performance of the spin valve type of magneto-resistance effect device can not be obtained in any conventional techniques.

SUMMARY OF THE INVENTION

It is an object of the present invention to provide an exchange coupling film, using an antiferromagnetic layer made of a disordered alloy, which can obtain larger exchange coupling energy than that of the exchange coupling film using an antiferromagnetic material made of an ordered alloy. The object of the present invention is achieved by solving a problem of the conventional exchange coupling film using the antiferromagnetic layer made of the disordered alloy such that coercive force of a pinning layer is small but the exchange coupling magnetic field is also small, and realizing the larger exchange coupling magnetic field with the small coercive force of the pinning layer maintained. It is an object of the present invention to provide a spin valve type of magneto-resistance effect device, which is provided with the exchange coupling film having such larger exchange coupling energy and has high operating stability and reliability, and a magneto-resistance sensor of a reproducing magnetic head and a magnetic random access memory which utilize the spin valve type of magneto-resistance effect device.

An exchange coupling film according to the invention comprises an antiferromagnetic layer formed of a disordered alloy, an exchange coupling giving layer formed of a ferromagnetic material selected from the group consisting of Co and CoFe alloy having face-centered cubic structure, being in contact with the antiferromagnetic layer, and giving exchange coupling at an interface between the antiferromagnetic layer and the exchange coupling giving layer, and an exchange coupling enhancement layer formed of a ferromagnetic material selected from the group consisting of Fe and CoFe alloy having body-centered cubic structure and provided on the exchange coupling giving layer so that the exchange coupling giving layer is sandwiched between the antiferromagnetic layer and the exchange coupling enhancement layer, the exchange coupling enhancement layer amplifying the exchange coupling by the exchange coupling giving layer.

According to the invention, in an exchange coupling film including the ferromagnetic layer of a pinning layer (fixing layer) and the antiferromagnetic layer, a double-layered film including the exchange coupling giving layer and the exchange coupling enhancement layer is used as the pinning layer and an optimum combination among the antiferromagnetic layer, the exchange coupling giving layer, and the exchange coupling enhancement layer is selected, which permits the exchange coupling to be increased comparing with the pinning layer of a single layer. That is to say, the exchange coupling can be remarkably increased in a manner that the antiferromagnetic layer is formed by the antiferromagnetic material including the disordered alloy, the exchange coupling giving layer is formed by the ferromagnetic material made of Co or the CoFe alloy having the face-centered cubic structure, and the exchange coupling enhancement layer is formed by the ferromagnetic material made of Fe or the CoFe alloy having the body-centered cubic structure.

Another exchange coupling film according to the invention comprises an antiferromagnetic layer formed of a disordered alloy, an exchange coupling giving layer formed of an amorphous ferromagnetic material made of CoFe, being in contact with the antiferromagnetic layer, and giving exchange coupling at an interface between the antiferromagnetic layer and the exchange coupling giving layer, and an exchange coupling enhancement layer formed of a ferromagnetic material selected from the group consisting of Fe and CoFe alloy having body-centered cubic structure and provided on the exchange coupling giving layer so that the exchange coupling giving layer is sandwiched between the antiferromagnetic layer and the exchange coupling enhancement layer, the exchange coupling enhancement layer amplifying the exchange coupling by the exchange coupling giving layer.

In the invention, the exchange coupling can be remarkably increased in a manner that the antiferromagnetic layer is formed by the antiferromagnetic material including the disordered alloy, the exchange coupling giving layer is formed by the amorphous ferromagnetic material made of CoFe, and the exchange coupling enhancement layer is formed by the ferromagnetic material made of Fe or the CoFe alloy having the body-centered cubic structure.

An IrMn alloy may be used as the disordered alloy. An FeMn alloy, the IrMn alloy, and a RhMn alloy of the face-centered cubic structure are known as the antiferromagnetic material made of the disordered alloy, particularly in case that the antiferromagnetic layer is made of the IrMn alloy, the most remarkable effect, namely extremely large exchange coupling magnetic field can be obtained.

A magneto-resistance effect device according to the invention comprises a magnetization fixing layer in which a direction of magnetic moment is fixed, a free layer in which the direction of the magnetic moment is rotated by an external magnetic field, and a nonmagnetic layer provided between the magnetization fixing layer and the free layer. The magnetization fixing layer comprises an antiferromagnetic layer formed of a disordered alloy, an exchange coupling giving layer formed of a ferromagnetic material selected from the group consisting of Co and CoFe alloy having face-centered cubic structure, being in contact with the antiferromagnetic layer, and giving exchange coupling at an interface between the antiferromagnetic layer and the exchange coupling giving layer, and an exchange coupling enhancement layer formed of a ferromagnetic material selected from the group consisting of Fe and CoFe alloy having body-centered cubic structure and provided on the exchange coupling giving layer so that the exchange coupling giving layer is sandwiched between the antiferromagnetic layer and the exchange coupling enhancement layer, the exchange coupling enhancement layer amplifying the exchange coupling by the exchange coupling giving layer.

In the invention, since an antiparallel state between the magnetic moment of a pinning layer and the magnetic moment of the free layer can be realized in a wide range of the magnetic field, operating stability of the magneto-resistance effect device can be achieved, which results in improvement of reliability. There are a giant magnetic resistance (GMR) type of magneto-resistance effect device whose nonmagnetic layer is made of Cu and a tunneling magnetic resistance (TMR) type of magneto-resistance effect device whose nonmagnetic layer is formed by a tunnel barrier insulator in the magneto-resistance effect devices, the same effect can be obtained in either type. Aluminum oxide ($AiO_x$) and aluminum nitride (AlN) are used as the tunnel barrier insulator.

Another magneto-resistance effect device according to the invention comprises a magnetization fixing layer in which a direction of magnetic moment is fixed, a free layer in which the direction of the magnetic moment is rotated by an external magnetic field, and a nonmagnetic layer provided between the magnetization fixing layer and the free layer. The magnetization fixing layer comprises an antiferromagnetic layer formed of a disordered alloy, an exchange coupling giving layer formed of an amorphous ferromagnetic material made of CoFe, being in contact with the antiferromagnetic layer, and giving exchange coupling at an interface between the antiferromagnetic layer and the exchange coupling giving layer, and an exchange coupling enhancement layer formed of a ferromagnetic material selected from the group consisting of Fe and CoFe alloy having body-centered cubic structure and provided on the exchange coupling giving layer so that the exchange coupling giving layer is sandwiched between the antiferromagnetic layer and the exchange coupling enhancement layer, the exchange coupling enhancement layer amplifying the exchange coupling by the exchange coupling giving layer.

A magnetic head according to the invention is a magnetic head with the magneto-resistance effect device. Because an antiparallel state between the magnetic moment of a pinning layer and that of the free layer can be realized in a wide range of the magnetic field by using an exchange coupling film as a magnetization fixing layer, operating stability of the magneto-resistance effect device and reliability can be improved. Consequently, the stability and the reliability of the magnetic head can be improved. The same effect can be obtained in both magnetic heads of the magnetic head including the giant magnetic resistance (GMR) type of magneto-resistance effect device whose nonmagnetic layer is made of Cu and the magnetic head including the tunneling magnetic resistance (TMR) type of magneto-resistance effect device whose nonmagnetic layer is formed by the tunnel barrier insulator.

A magnetic random access memory according to the invention is a magnetic random access memory with the magneto-resistance effect device. Because an antiparallel state between the magnetic moment of a pinning layer and that of the free layer can be realized in a wide range of the magnetic field by using an exchange coupling film as a magnetization fixing layer, operating stability of the device and reliability can be improved. Consequently, the stability and the reliability of the magnetic random access memory (MRAM) can be improved. The same effect can be obtained in both random access memories of the random access memory including the giant magnetic resistance (GMR) type of magneto-resistance effect device whose nonmagnetic layer is made of Cu and the magnetic random access memory including the tunneling magnetic resistance (TMR) type of magneto-resistance effect device whose nonmagnetic layer is formed by the tunnel barrier insulator.

As described above in detail, according to the invention, the larger exchange coupling magnetic field is achieved with the small coercive force of the pinning layer maintained, which permits the exchange coupling film having the large exchange coupling energy to be obtained in the exchange coupling film using the antiferromagnetic layer including the disordered alloy.

DETAILED DESCRIPTION OF THE PREFERRED EMBODIMENTS

It has been thought that exchange coupling acts on an interface between an antiferromagnetic layer and a ferromagnetic layer (pinning layer). However, it was found by the present inventors through research that the exchange coupling is not decided by only the interface between the antiferromagnetic layer and the ferromagnetic layer, but the exchange coupling can be increased in a manner that the ferromagnetic layer (pinning layer) is formed of a double-layered structure and the double-layered structure of the ferromagnetic layer and the antiferromagnetic layer are combined under optimum conditions. That is to say, the exchange coupling can be increased remarkably than ever in a manner that the pinning layer includes an exchange coupling giving layer for generating the exchange coupling with the antiferromagnetic layer and an exchange coupling enhancement layer for amplifying the exchange coupling.

Figure 1:
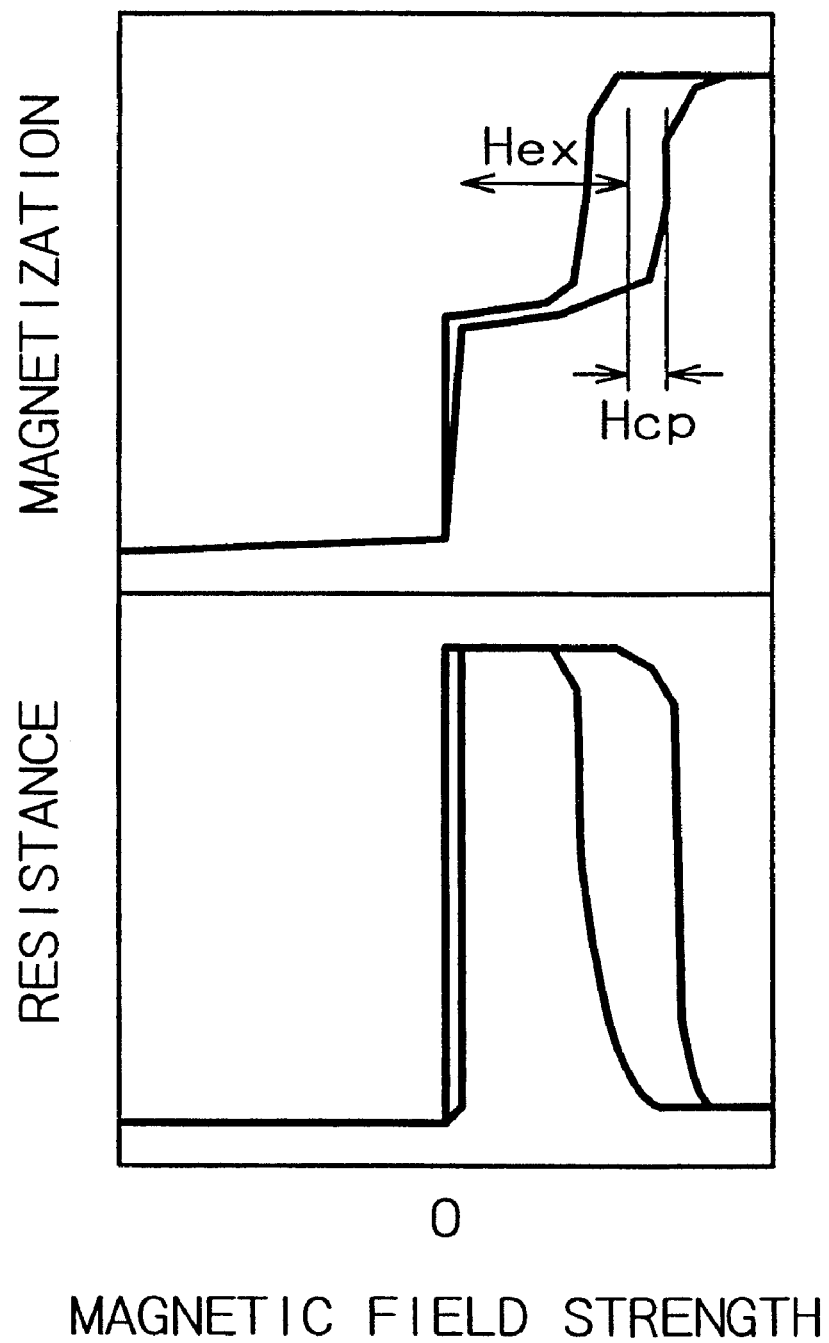
FIG. 1 is a graph showing hysteresis curves of dependence of magnetization of a spin valve type of magneto-resistance effect device on a magnetic field (M-H curve) and dependence of resistance (inverse number of conductance) on the magnetic field (R-H curve), where transverse axes are magnetic field strength and longitudinal axes are magnetization and resistance.
Figure 2:
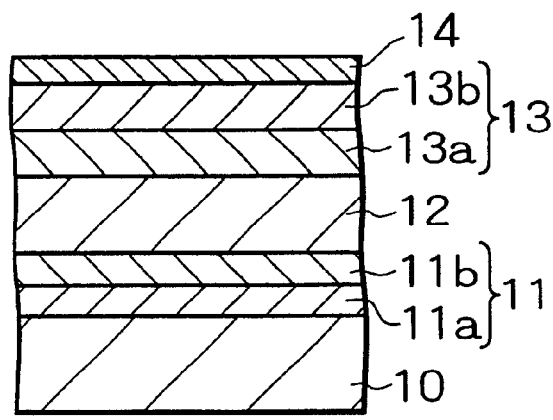
FIG. 2 is a cross-sectional view showing an exchange coupling film of a first embodiment of the invention.

Embodiments of the invention will be described below referring to accompanying drawings. At first, a first embodiment of the invention will be described. FIG. 2 is a cross-sectional view showing an exchange coupling film of the first embodiment of the invention. As shown in FIG. 2, a foundation layer 11, an antiferromagnetic layer 12, a ferromagnetic layer (pinning layer) 13, and a cap protection layer 14 are built-up on a substrate 10 in the order. The exchange coupling film shown in FIG. 2 is a so-called Bottomantiferromagnetic (AF) type of exchange coupling film in which the antiferromagnetic layer 12 is placed under the ferromagnetic layer of pinning layer 13. The foundation layer 11 includes a foundation layer 11a increasing adhesive properties to the substrate 10 and a foundation layer 11b controlling orientation of the antiferromagnetic layer 12, the foundation layer 11a is formed on the substrate 10, the foundation layer 11b is formed on the foundation layer 11a, and the antiferromagnetic layer 12 is formed on the foundation layer 11b. The foundation layer 11b is not always necessary, it depends on a kind of the antiferromagnetic layer 12 formed on the foundation layer 11b. In the exchange coupling film of the embodiment, the ferromagnetic layer (pinning layer) 13 should be exchange-coupled by the antiferromagnetic layer 12. And, the pinning layer 13 includes two ferromagnetic layers of an exchange coupling giving layer 13a being in contact with the antiferromagnetic layer 12 and an exchange coupling enhancement layer 13b formed on the exchange coupling giving layer 13a. The cap protection layer 14 is formed to prevent a surface of the pinning layer 13 from being oxidized, however the cap protection layer 14 may be neglected.

In order to explain operation of the exchange coupling enhancement layer 13b, a case that the pinning layer 13 is a single layer, namely the pinning layer 13 includes only the exchange coupling giving layer (hereinafter referred to as "single-layered pinning layer"), and a case that the pinning layer is double-layered, namely the pinning layer 13 includes the exchange coupling giving layer 13a and the exchange coupling enhancement layer 13b (hereinafter referred to as "double-layered pinning layer") are considered.

Suppose that a product obtained by multiplying saturation magnetization of the single-layered pinning layer by a film thickness of the single-layered pinning layer is equal to a sum of the product obtained by multiplying the saturation magnetization of the exchange coupling giving layer 13a in the double-layered pinning layer by the film thickness of the exchange coupling giving layer 13a and the product obtained by multiplying the saturation magnetization of the exchange coupling enhancement layer 13b by the film thickness of the exchange coupling enhancement layer 13b. If the exchange coupling is to follow a conventional thinking that the exchange coupling is generated as an interfacial effect between the antiferromagnetic material and the ferromagnetic material, since the exchange coupling giving layer is in contact with the antiferromagnetic layer in both cases, the exchange coupling energy of both layers is equal, accordingly difference in exchange coupling magnetic field should not be generated. However, when the ferromagnetic layer being in contact with the antiferromagnetic layer is divided into two layers and the two layers is combined under optimum conditions, compared with the single-layered pinning layer, the exchange coupling energy is increased in the double-layered pinning layer, which causes the exchange coupling magnetic field to be increased remarkably. That is to say, the exchange coupling enhancement layer has just the function increasing the exchange coupling, compared with the case that the pinning layer is formed only by the exchange coupling giving layer.

An important point to increase the exchange coupling is the combination of the antiferromagnetic layer, the exchange coupling giving layer, and the exchange coupling enhancement layer which are included in the exchange coupling film. In the embodiment, a case that the antiferromagnetic layer 12 is formed by an IrMn alloy being the antiferromagnetic material of a disordered alloy will be described. The ferromagnetic material made of Co or a $Co_{100-X}Fe_X$ alloy having the face-centered cubic structure as the exchange coupling giving layer 13a is the most suitable for the antiferromagnetic layer 12 made of the IrMn alloy. In this case, the face-centered cubic structure is stable when X is in a range of $0 \leq X < 25$ (at %). In case that the exchange coupling giving layer 13a is formed by Ni, a ferromagnetic alloy including Ni even in the face-centered cubic structure, or the ferromagnetic alloy having the body-centered cubic structure even in the CoFe alloy, the large exchange coupling can not be obtained. On the other hand, when Fe or a $Co_{100-Y}Fe_Y$ alloy having the body-centered cubic structure is combined as the exchange coupling enhancement layer, the exchange coupling is increased. The body-centered cubic structure is stable when Y is in a range of $25 \leq Y < 100$ (at %). In case that the exchange coupling enhancement layer 13b is formed by the CoFe alloy having the face-centered cubic structure or the ferromagnetic alloy including Ni even in the body-centered cubic structure, the large exchange coupling can not be obtained.

In case that the antiferromagnetic layer 12 is made of the IrMn alloy, the exchange coupling giving layer 13a is made of an amorphous ferromagnetic alloy including mainly CoFe, the large exchange coupling is obtained, even though a combination is formed by Fe or the ferromagnetic material including the CoFe alloy having the body-centered cubic structure. In order to increase the exchange coupling, it is desirable that the amorphous ferromagnetic material forming the exchange coupling giving layer 13a does not contain Ni, and it is preferable that the amorphous ferromagnetic material is mainly made of CoFe such as CoFeB, CoFeSiB, CoZrTa, FeSiB, FeAlSi, FeC, and FeTaC. In case that the exchange coupling giving layer 13a is formed by the amorphous ferromagnetic material, Fe or the $Co_{100-Y}Fe_Y$ alloy having the body-centered cubic structure is combined as the exchange coupling enhancement layer 13b, the exchange coupling is increased. When the exchange coupling enhancement layer 13b is formed by the CoFe alloy having the face-centered cubic structure or the ferromagnetic alloy including Ni even in the body-centered cubic structure, the large exchange coupling can not be obtained.

In case that the antiferromagnetic layer 12 is made of the IrMn alloy, the foundation layer 11a is preferably made of Ta, Ti, Zr, Hf, and Pd, the foundation layer 11b is preferably made of NiFe, NiFeNb, Cu, and $Co_{90}Fe_{10}$. The cap protection layer 14 is made of Ta, Al, Cu, or Au, and there is no special limitation if the cap protection layer 14 is a dense film being capable of protecting a surface of the exchange coupling enhancement layer 13b.

In case that the antiferromagnetic layer 12 is made of IrMn, by dividing the pinning layer 13 into two layers of the exchange coupling giving layer 13a and the exchange coupling enhancement layer 13b, compared to the single-layered pinning layer, increment of the exchange coupling energy will be described concretely. In the Bottom-AF type of exchange coupling film having a configuration of substrate/Ta layer (5 nm)/NiFe layer (3 nm)/IrMn layer (10 nm)/pinning layer, when the pinning layer is only the single-layered pinning layer of $Co_{90}Fe_{10}$ layer (2.5 nm), the exchange coupling magnetic field $H_{ex}$ is 400 Oe and the exchange coupling energy J is $0.15 \times 10^{-7} J/cm^2$, on the other hand, when the pinning layer is the double-layered pinning layer including a $Co_{90}Fe_{10}$ layer (1.0 nm) as the exchange coupling giving layer and a $Co_{30}Fe_{70}$ layer (1.1 nm) as the exchange coupling enhancement layer, a large increasing effect is recognized, namely $H_{ex}$ is 950 Oe and J is $0.35 \times 10^{-7} J/cm^2$.

At this point, the magnetization (saturation magnetization×film thickness) of the $Co_{90}Fe_{10}$ layer (2.5 nm) in the single-layered pinning layer is equal to the magnetization of the $Co_{90}Fe_{10}$ layer (1.0 nm)/$Co_{30}Fe_{70}$ layer (1.1 nm) in the double-layered pinning layer. As described above, it is thought that the exchange coupling acts the interface between the antiferromagnetic layer and the ferromagnetic layer, according to the thinking, it is difficult to think generation of large difference between both exchange coupling, because the $Co_{90}Fe_{10}$ layer is in contact with the antiferromagnetic layer of IrMn in both cases of the single-layered pinning layer and the double-layered pinning layer. That is to say, it is understood that the exchange coupling is not decided by only the interface between the antiferromagnetic layer and the ferromagnetic layer, however the exchange coupling enhancement layer enhances literally the exchange coupling acting between the antiferromagnetic layer and the exchange coupling giving layer.

Figure 3:
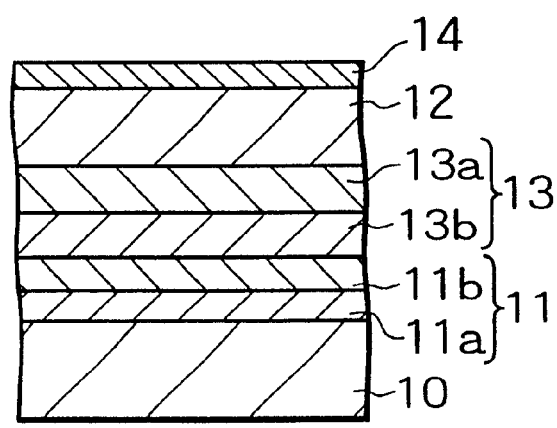
FIG. 3 is a cross-sectional view showing an exchange coupling film of a variation of the first embodiment.

A variation of the embodiment will be described below. FIG. 3 is a cross-sectional view showing an exchange coupling film of the variation. As shown in FIG. 3, the exchange coupling film of the variation is a so-called Top-AF type of exchange coupling film in which the antiferromagnetic layer 12 is formed on the pinning layer 13. In the exchange coupling film of the variation, the foundation layer 11a, the foundation layer 11b, the exchange coupling enhancement layer 13b, the exchange coupling giving layer 13a, the antiferromagnetic layer 12, and the cap protection layer 14 are built-up on the substrate 10 in the order. The foundation layer 11 includes the foundation layer 11a and the foundation layer 11b, the pinning layer 13 includes the exchange coupling enhancement layer 13b and the exchange coupling giving layer 13a. Namely, in the exchange coupling film of the variation, compared to the exchange coupling film of the first embodiment shown in FIG. 2, the antiferromagnetic layer 12 and the pinning layer 13 are formed in the reverse order. Though a configuration of the foundation layer 11a and the foundation layer 11b is selected corresponding to the ferromagnetic layer 13 like the Bottom-AF type of exchange coupling film shown in FIG. 2, it is not always necessary that the foundation layer 11 is double-layered, it is possible to neglect the foundation layer 11b. In the variation, other configurations and operation except the above description are the same as the first embodiment.

Figure 4:
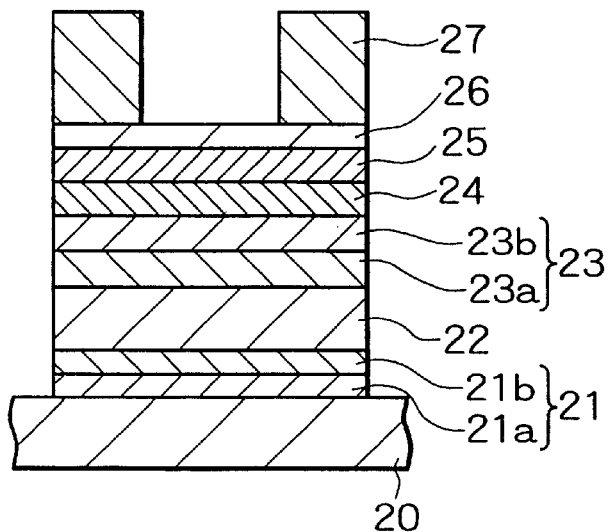
FIG. 4 is a cross-sectional view showing a Bottom-AF type of GMR magneto-resistance effect device of a second embodiment of the invention.

A second embodiment of the invention will be described below. FIG. 4 is a cross-sectional view showing a Bottom-AF type of GMR magneto-resistance effect device of the embodiment. The embodiment is in regard to a GMR type of magneto-resistance effect device (hereinafter referred to as "GMR device") utilizing an exchange coupling film of the invention. As shown in FIG. 4, in the spin valve type of magneto-resistance effect device including antiferromagnetic layer/pinning layer/nonmagnetic layer/free layer, the GMR device of the embodiment is the GMR type of magneto-resistance effect device of the Bottom-AF type that the above-described exchange coupling film including antiferromagnetic layer/exchange coupling giving layer/exchange coupling enhancement layer is used as the exchange coupling film including the antiferromagnetic layer and the pinning layer, the nonmagnetic layer is made of a nonmagnetic metal such as Cu, and the antiferromagnetic layer is placed under the nonmagnetic layer.

As shown in FIG. 4, in the GMR device of the embodiment, a foundation layer 21a, a foundation layer 21b, an antiferromagnetic layer 22, an exchange coupling giving layer 23a, an exchange coupling enhancement layer 23b, a nonmagnetic metal layer 24, a free layer 25, and a cap protection layer 26 are built-up on a substrate 20 in the order, electrodes 27 are formed on the cap protection layer 26.

The foundation layer 21a is to secure adhesive properties to the substrate, the foundation layer 21b is to control orientation of the antiferromagnetic layer 22. The foundation layer 21 includes the foundation layer 21a and the foundation layer 21b. The foundation layer 21b is not always necessary, it depends on a kind of the antiferromagnetic layer 22. The exchange coupling giving layer 23a is the ferromagnetic layer being in contact with the antiferromagnetic layer 22 and generating the exchange coupling between the antiferromagnetic layer 22 and the exchange coupling giving layer 23a, the exchange coupling enhancement layer 23b is the ferromagnetic layer increasing the exchange coupling. The pinning layer 23 is formed by the exchange coupling giving layer 23a and the exchange coupling enhancement layer 23b. A direction of magnetic moment in the pinning layer 23 is fixed by the exchange coupling. The nonmagnetic metal layer 24 is made of Cu. A direction of the magnetic moment in the free layer 25 can be rotated by an external magnetic field. The cap protection layer 26 is provided so as to prevent a surface of the free layer 25 from being oxidized.

The combination of the antiferromagnetic layer 22, the exchange coupling giving layer 23a, and the exchange coupling enhancement layer 23b is as described particularly in the first embodiment, it is preferable that the combination includes the antiferromagnetic layer 22 made of IrMn, the exchange coupling giving layer 23a made of Co or the ferromagnetic material of the CoFe alloy having the face-centered cubic structure, and the exchange coupling enhancement layer 23b made of Fe or the ferromagnetic material of the CoFe alloy having the body-centered cubic structure. The CoFe alloy having the face-centered cubic structure forming the exchange coupling giving layer 23a is in a range of $0 \leq X < 25$ (at %) where the CoFe alloy is represented as $Co_{100-X}Fe_X$, the CoFe alloy having the body-centered cubic structure forming the exchange coupling enhancement layer 23b is in a range of $25 \leq Y < 100$ (at %) where the CoFe alloy is represented as $Co_{100-Y}Fe_Y$.

It is also possible that the combination includes the antiferromagnetic layer 22 made of IrMn, the exchange coupling giving layer 23a made of the amorphous ferromagnetic material containing mainly CoFe, and the exchange coupling enhancement layer 23b made of Fe or the ferromagnetic material of the CoFe alloy having the body-centered cubic structure. The amorphous ferromagnetic material forming the exchange coupling giving layer 23a can be made of CoFeB, CoZrTa, CoFeSiB, FeC, or FeAlSi.

Cu is the most preferable material for forming the nonmagnetic metal layer 24, the film thickness of the nonmagnetic metal layer 24 is preferably in a range of 2 to 4 nm. It is possible that a single layer film containing one kind of the material selected from a group including NiFe, NiFeCo, CoZrNb, CoFe, Sendust, and FeTaN or a multilayered film including at least two kinds of materials selected from the group is used as the free layer 25. The film thickness of the free layer 25 is preferably in a range of about 1 to about 10 nm. In the Bottom-AF type of GMR device shown in FIG. 4, when the antiferromagnetic layer 22 is made of IrMn, it is preferable that the foundation layer 21a is made of Ta, Ti, Zr, Hf, or Pd, the foundation layer 21b is made of NiFe, NiFeNb, Cu, or $Co_{90}Fe_{10}$. The cap protection layer 26 is made of Ta, Al, Cu, or Au, and there is no special limitation if the cap protection layer 26 is a dense film being capable of protecting a surface of the exchange coupling enhancement layer 23b.

In the GMR device of the embodiment, since the pinning layer 23 includes two layers of the exchange coupling giving layer 23a and the exchange coupling enhancement layer 23b, the larger exchange coupling can be obtained, which results in the larger magneto-resistance effect.

Figure 5:
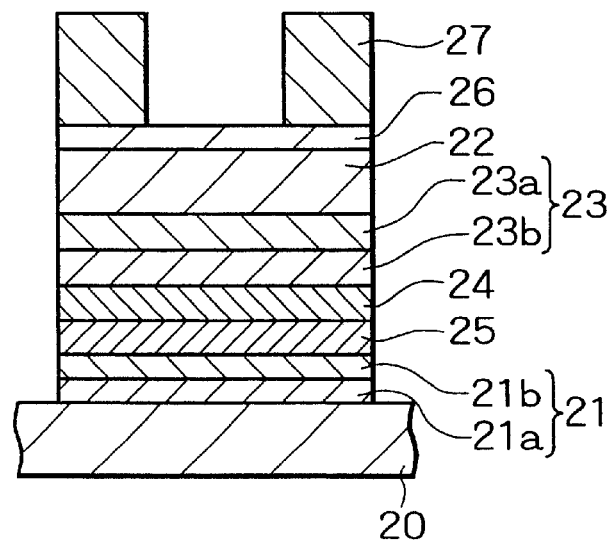
FIG. 5 is a cross-sectional view showing a Top-AF type of GMR magneto-resistance effect device of a variation of the second embodiment.

A variation of the embodiment will be described below. FIG. 5 is a cross-sectional view showing a GMR device of the variation. As shown in FIG. 5, the GMR device of the variation is a so-called Top-AF type of GMR device in which the antiferromagnetic layer is placed on the nonmagnetic metal layer. In the GMR device, the foundation layer 21a, the foundation layer 21b, the free layer 25, the nonmagnetic metal layer 24, the exchange coupling enhancement layer 23b, the exchange coupling giving layer 23a, the exchange coupling enhancement layer 23b, the antiferromagnetic layer 22, and the cap protection layer 26 are built-up on the substrate 20 in the order, the electrodes 27 are formed on the cap protection layer 26. The foundation layer 21 includes the foundation layer 21a and the foundation layer 21b, the pinning layer 23 includes the exchange coupling enhancement layer 23b and the exchange coupling giving layer 23a. Compared to the GMR device of the second embodiment shown in FIG. 4, the antiferromagnetic layer 22 and the ferromagnetic layer (pinning layer) 23 are formed in the reverse order because the GMR device of the variation is the Top-AF type of configuration.

The foundation layer 21a and the foundation layer 21b are selected corresponding to the free layer 25 like the Bottom-AF type of GMR device shown in FIG. 4. It is not always necessary that the foundation layer 21 is double-layered, it is possible to neglect the foundation layer 21b. In the Top-AF type of GMR device of the variation, when the free layer 25 is made of NiFe or NiFeCo of the alloy having the face-centered cubic structure, the foundation layer 21 is made of Ta, Zr, Hf, or W to increase crystal orientation of the free layer 25, which permits a ratio of change of the magnetic resistance (MR ratio) to be increased.

Figure 6:
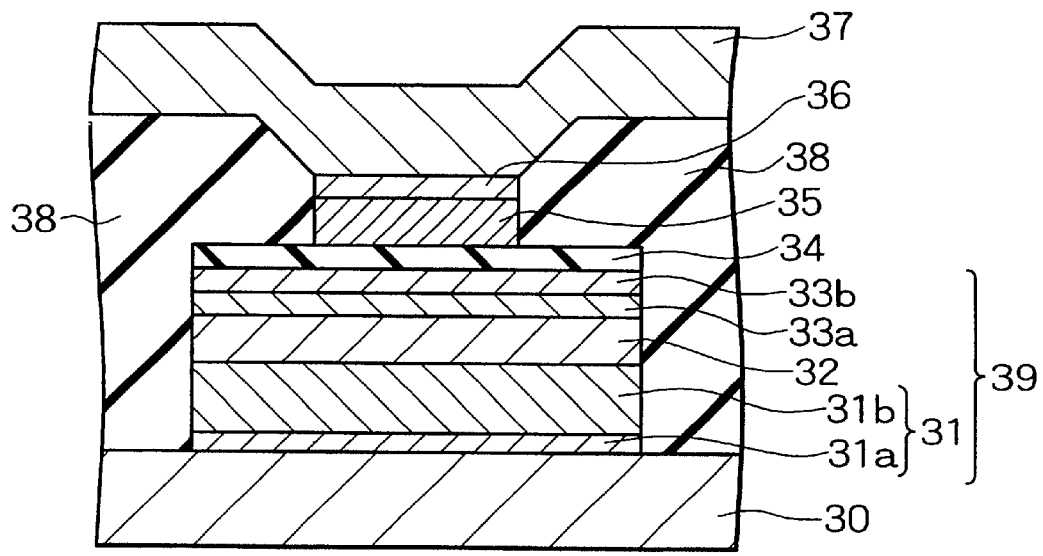
FIG. 6 is a cross-sectional view showing a TMR type of magneto-resistance effect device of a third embodiment of the invention.

A third embodiment of the invention will be described below. FIG. 6 is a cross-sectional view showing a TMR type of magneto-resistance effect device of the embodiment. The exchange coupling film of the invention is applied to the GMR type of magneto-resistance effect device in the above-described second embodiment, on the other hand, the exchange coupling film of the invention is applied to the TMR type of magneto-resistance effect device in the third embodiment. In the spin valve type of magneto-resistance effect device including antiferromagnetic layer/pinning layer/nonmagnetic layer/free layer, the embodiment is the TMR type of magneto-resistance effect device in which the exchange coupling film including the above-described antiferromagnetic layer/exchange coupling giving layer/exchange coupling enhancement layer is used as the exchange coupling film of antiferromagnetic layer/pinning layer and the nonmagnetic layer includes an insulator (tunnel barrier layer) such as aluminum oxide ($AlO_X$) or aluminum nitride (AlN).

As shown in FIG. 6, the TMR type of magneto-resistance effect device is the Bottom-AF type of TMR device. A foundation layer 31a, a foundation layer 31b, an antiferromagnetic layer 32, an exchange coupling giving layer 33a, an exchange coupling enhancement layer 33b, a tunnel barrier layer 34, a free layer 35, and a cap protection layer 36 are built-up on a substrate 30 in the order. An interlayer dielectric 38 is formed around the layers, an upper electrode 37 is formed on the cap protection layer 36 and the interlayer dielectric 38. A foundation layer 31 includes the foundation layer 31a securing adhesive properties to the substrate 30 and the foundation layer 31b controlling orientation of the antiferromagnetic layer 32. The foundation layer 31b is not always necessary, it depends on a kind of the antiferromagnetic layer 32. The ferromagnetic layer (pinning layer) 33, which is exchange-coupled by the antiferromagnetic layer 32, is formed by two ferromagnetic layers of the exchange coupling giving layer 33a being in contact with the antiferromagnetic layer 32 and the exchange coupling enhancement layer 33b. A lower electrode 39 is formed by the foundation layer 31, the antiferromagnetic layer 32, the pinning layer 33, and the tunnel barrier layer 34.

In the TMR type of magneto-resistance effect device of the embodiment, aluminum oxide ($AlO_X$) is often used as the tunnel barrier layer 34. The cap protection layer 36 is provided so as to prevent a surface of the free layer 35 from being oxidized. FIG. 6 is a so-called Bottom-AF type of TMR device in which the antiferromagnetic layer 32 is placed under the tunnel barrier layer 34 (substrate 30 side).

The combination of the antiferromagnetic layer 32, the exchange coupling giving layer 33a, and the exchange coupling enhancement layer 33b is as described particularly in the first embodiment, it is preferable that the combination consists of the antiferromagnetic layer 32 made of IrMn, the exchange coupling giving layer 33a made of Co or the ferromagnetic material of the CoFe alloy having the face-centered cubic structure, and the exchange coupling enhancement layer 33b made of Fe or the ferromagnetic material of the CoFe alloy having the body-centered cubic structure. The CoFe alloy of the face-centered cubic structure forming the exchange coupling giving layer 33a is in a range of $0 \leq X < 25$ (at %) where the CoFe alloy is represented as $Co_{100-X}Fe_X$, the CoFe alloy of the body-centered cubic structure forming the exchange coupling enhancement layer 33b is in a range of $25 \leq Y < 100$ (at %) where the CoFe alloy is represented as $Co_{100-Y}Fe_Y$. It is also possible that the combination consists of the antiferromagnetic layer 32 made of IrMn, the exchange coupling giving layer 33a made of the amorphous ferromagnetic material including mainly CoFe, and the exchange coupling enhancement layer 33b made of Fe or the ferromagnetic material of the CoFe alloy having the body-centered cubic structure. The amorphous ferromagnetic material including mainly CoFe forming the exchange coupling giving layer 33a can be made of CoFeB, CoZrTa, CoFeSiB, FeC, or FeAlSi.

Aluminum oxide ($AlO_X$), oxide such as magnesium oxide (MgO) and tantalum pentoxide ($Ta_2O_5$), or nitride such as aluminum nitride (AlN) is applicable to the tunnel barrier layer 34. It is preferable that the thickness of the tunnel barrier layer 34 is in a range of 0.5 to 4 nm. The tunnel barrier layer 34 is generally formed by a natural oxidation method in which the nonmagnetic metal layer (Al, Mg, and Ta) is formed on the pinning layer 33 (on the exchange coupling enhancement layer 33b in case of the TMR device shown in FIG. 6) and then gas including oxygen is introduced into a deposition apparatus to oxidize the metal layer. The tunnel barrier layer 34 is also generally formed by a plasma oxidation method or a plasma nitridation method in which the nonmagnetic metal layer is formed on the pinning layer 33 and then plasma is generated by gas including oxygen or nitrogen to oxidize or nitride the metal layer. Furthermore, there are a method that the tunnel barrier layer 34 is formed by sputtering a target such as $AlO_X$, MgO, $Ta_2O_5$ or AlN and a method that the tunnel barrier layer 34 is formed by reactive sputtering of a metal target such as Al, Mg, or Ta.

It is possible that the free layer 35 uses a single or multilayered film including NiFe, NiFeCo, CoZrNb, CoFe, Sendust, and FeTaN. The film thickness of the free layer 35 is preferably in a range of about from 1 to about 10 nm. In the Bottom-AF type of TMR device shown in FIG. 6, when the antiferromagnetic layer 32 is made of IrMn, it is preferable that the foundation layer 31a is made of Ta, Ti, Zr, Hf, or Pd, and the foundation layer 31b is made of NiFe, NiFeNb, Cu, or $Co_{90}Fe_{10}$.

Figure 7:
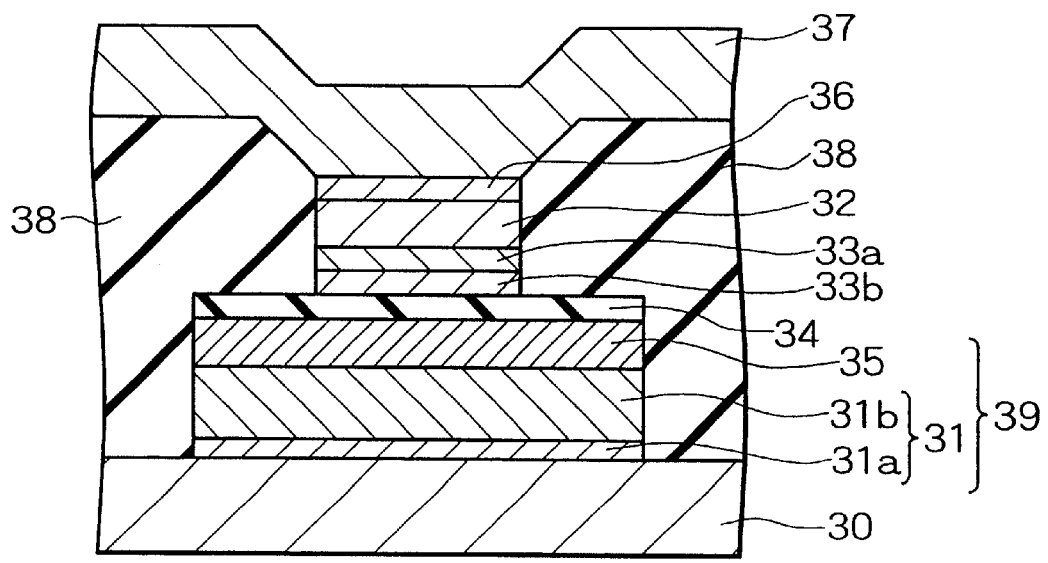
FIG. 7 is a cross-sectional view showing a TMR type of magneto-resistance effect device of a variation of the third embodiment.

A variation of the embodiment will be described below. FIG. 7 is a cross-sectional view showing a TMR device of the variation. As shown in FIG. 7, the TMR device of the variation is a so-called Top-AF type of TMR device in which the antiferromagnetic layer 32 is placed on the tunnel barrier layer 34. As shown in FIG. 7, in the TMR device of the variation, the foundation layer 31, the free layer 35, the tunnel barrier layer 34, the ferromagnetic layer (pinning layer) 33, the antiferromagnetic layer 32, and the cap protection layer 36 are built-up on the substrate 30 in the order. The interlayer dielectric 38 is formed around the layers, the upper electrode 37 is formed on the cap protection layer 36 and the interlayer dielectric 38. Compared to the TMR device shown in FIG. 6, the antiferromagnetic layer 32 and the ferromagnetic layer (pinning layer) 33 are formed in the reverse order. In case of the Top-AF type of TMR device, the exchange coupling enhancement layer 33b, the exchange coupling giving layer 33a, the antiferromagnetic layer 32, and the cap protection layer 36 are formed on the tunnel barrier layer 34 in the order.

In the same way as the Bottom-AF type of TMR device shown in FIG. 6, the foundation layer 31 includes the foundation layer 31a and the foundation layer 31b, the foundation layer 31 is selected corresponding to the free layer 35. For example, when the free layer 35 is made of the NiFe or NiFeCo alloy of the face-centered cubic structure, the foundation layer 31b is made of Ta, Zr, Hf, or W to increase the crystal orientation of the free layer 35, which causes the ratio of change of the magnetic resistance (MR ratio) to be increased. It is not always necessary that the foundation layer 31 is the double-layered structure. The cap protection layer 36 is made of Ta, Al, Cu, or Au, and there is no special limitation if the cap protection layer 36 is a dense film being capable of protecting a ferromagnetic surface of the exchange coupling enhancement layer.

Figure 8:
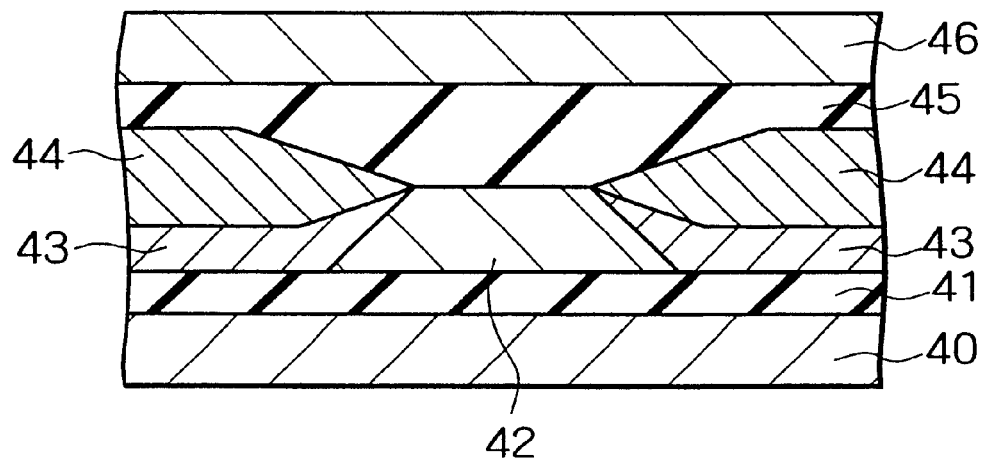
FIG. 8 is a cross-sectional view showing a reproducing magnetic head of a HDD apparatus of a fifth embodiment of the invention.

A fourth embodiment of the invention will be described below. FIG. 8 is a cross-sectional view showing a reproducing magnetic head of a HDD apparatus of the embodiment. The GMR or TMR type of magneto-resistance effect device of the second or third embodiment can be used as a magnetic sensor to constitute the reproducing magnetic head of the HDD apparatus. FIG. 8 shows a mode using the GMR type of magneto-resistance effect device of the invention as the magnetic sensor of the reproducing magnetic head. In the embodiment, an example of the Top-AF type of GMR magneto-resistance effect device shown in FIG. 5 will be described.

As shown in FIG. 8, in the reproducing magnetic head of the embodiment, an insulating layer 41 is provided on a lower shield layer 40, the GMR type of magneto-resistance effect device portion 42 processed in a shape of trapezoid is provided on the insulating layer 41, a longitudinal bias layer 43 which makes the free layer in the GMR type of magneto-resistance effect device portion 42 a single magnetic domain is provided both sides of the GMR type of magneto-resistance effect device portion 42 on the insulating layer 41, and electrodes 44 which flow current to the GMR type of magneto-resistance effect device portion 42 are provided on the longitudinal bias layer 43. A gap layer 45 which separates the GMR type of magneto-resistance effect device portion 42 from a recording head portion (not shown) is provided on the electrodes 44 and the GMR type of magneto-resistance effect device portion 42, an upper shield layer 46 is provided on the gap layer 45. A configuration of the GMR type of magneto-resistance effect device portion 42 is the same as that of the Top-AF type of GMR magneto-resistance effect device shown in FIG. 5.

The lower shield layer 40 is made of a soft magnetic material such as CoZrTa, the insulating layer 41 and the gap layer 45 is made of aluminum, the longitudinal bias layer (hard layer) 43 is made of a hard magnetic material such as CoCrPt, the electrodes 44 are made of Au. The GMR type of magneto-resistance effect device portion 42 is a spin valve type of magneto-resistance effect device including free layer/Cu layer/pinning layer/antiferromagnetic layer, the exchange coupling film of pinning layer/antiferromagnetic layer is the exchange coupling film including exchange coupling enhancement layer/exchange coupling giving layer/antiferromagnetic layer described in the second embodiment.

Figure 9:
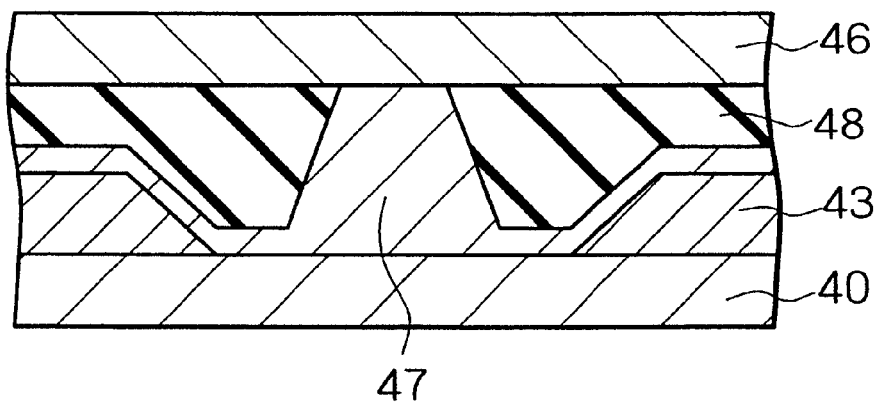
FIG. 9 is a cross-sectional view showing a reproducing magnetic head of a HDD apparatus of a variation of the fifth embodiment.

A variation of the embodiment will be described below. FIG. 9 is a cross-sectional view showing a reproducing magnetic head of the variation. The variation is a mode using the Top-AF type of TMR type of magneto-resistance effect device shown in FIG. 7 as the magnetic sensor of the reproducing magnetic head. As shown in FIG. 9, in the reproducing magnetic head of the variation, the TMR type of magneto-resistance effect device portion 47 processed in a certain shape for remaining a free layer and the longitudinal bias layer (hard layer) 43 which makes the free layer a single magnetic domain are formed between the lower shield layer 40 and the upper shield layer 46, surroundings of the TMR type of magneto-resistance effect device portion 47 are buried by the interlayer dielectric 48. The lower shield layer 40 and the upper shield layer 46 also have a function of an electrode flowing current to the TMR type of magneto-resistance effect device portion 47. The upper and lower shield layers 40 and 46 are made of the soft magnetic material such as CoZrTa, the interlayer dielectric 48 is made of aluminum oxide or $SiO_2$, the longitudinal bias layer 43 is made of the hard magnetic material such as CoCrPt. Au may be formed on the TMR type of magneto-resistance effect device portion 47 in order to reduce contact resistance between the TMR type of magneto-resistance effect device portion 47 and the upper shield layer 46. The TMR type of magneto-resistance effect device portion 47 is the spin valve type of magneto-resistance effect device including free layer/tunnel barrier layer/pinning layer/antiferromagnetic layer, the exchange coupling film of pinning layer/antiferromagnetic layer is the exchange coupling film including exchange coupling enhancement layer/exchange coupling giving layer/antiferromagnetic layer described in the second embodiment.

Figure 10:
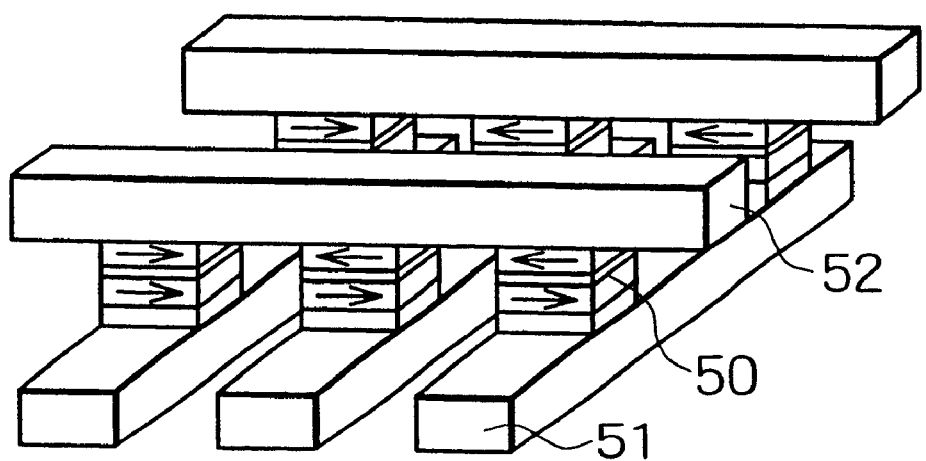
FIG. 10 is a perspective view showing a magnetic random access memory of a fourth embodiment of the invention.

A fifth embodiment of the invention will be described below. FIG. 10 is a perspective view showing a magnetic random access memory of the embodiment. As shown in FIG. 10, the embodiment is a magnetic memory of the random access memory in which the GMR or TMR type of magneto-resistance effect device of the second or third embodiment is inserted between two electric leads crossing at right angles.

As shown in FIG. 10, in the embodiment, a bit line 51 and a word line 52 crossing at right angles each other are provided, a cell 50 including the TMR type of magneto-resistance effect device containing an exchange coupling film of the invention is placed between the bit line 51 and the word line 52. A configuration of the TMR type of magnetoresistance effect device is the same as that of the TMR type of magneto-resistance effect device shown in the third embodiment (refer to FIG. 6).

In the random access memory of the embodiment, current flowing through the bit line 51 and the word line 52 forms a resultant magnetic field, a magnetizing direction of a free layer in the selected cell 50 is reversed by the resultant magnetic field, which permits information to be written. The feeble current is flown through the bit line 51 and the word line 52 to detect resistance of the selected cell 50, which permits the information to be read.

The cell 50 including the TMR type of magneto-resistance effect device inserted between the bit line 51 and the word line 52 crossing at right angles each other is the spin valve type of magneto-resistance effect device including free layer/tunnel barrier layer/pinning layer/antiferromagnetic layer, the exchange coupling film of pinning layer/antiferromagnetic layer is the exchange coupling film including exchange coupling enhancement layer/exchange coupling giving layer/antiferromagnetic layer described in the third embodiment. Each cell is separated by an interlayer dielectric (not shown).

It is further understood by those skilled in the art that the foregoing description is a preferred embodiment of the disclosed device and that various changes and variations may be made in the invention without departing from the spirit and scope thereof.

Advantages of the invention will be concretely described comparing with comparative examples out of a scope of claims of the invention. A deposition apparatus used for forming the exchange coupling film or the magneto-resistance effect device film of the embodiments of the invention will be described before the description of the concrete embodiments of the invention. The deposition apparatus includes a load lock chamber used for loading and unloading the substrate, a tunnel barrier forming chamber for forming the tunnel barrier layer of the TMR type of magneto-resistance effect device film, sputtering chamber. Each chamber has an independent evacuating system, and each chamber is isolated by a gate valve. The substrate can be traveled freely between three chambers by a linear feed through. Backing pressure of the load lock chamber, the tunnel barrier forming chamber, and the sputtering chamber are at most $1.3 \times 10^{-4}$ Pa, at most $6.7 \times 10^{-6}$ Pa, and at most $2.7 \times 10^8$ respectively. The tunnel barrier forming chamber is provided with means for introducing gas containing oxygen or nitrogen and means for generating plasma by an RF coil. The sputtering chamber is provided with six magnetron sputtering sources. Argon pressure during sputtering is controlled in a range from 0.13 to 0.67 Pa corresponding to a kind of sputtering material. Magnetic field of about 50 Oe in magnetic field intensity is applied in a direction parallel to a surface of the substrate during deposition.

(First Experiment)

A first experiment will be described. An exchange coupling film estimated in the experiment is the exchange coupling film having the Bottom-AF type of configuration shown in FIG. 2. The exchange coupling film having the double-layered pinning layer whose pinning layer 13 includes the exchange coupling giving layer 13a and the exchange coupling enhancement layer 13b was produced as the experiment, the exchange coupling film having the conventional single-layered pinning layer was also produced for comparison.

Concretely, a Ta layer (1.5 nm) as the foundation layer 11a, a NiFe layer (2.0 nm) as the foundation layer 11b, and an IrMn layer (10 nm) as the antiferromagnetic layer 12 were formed on the silicon substrate 10 whose surface was thermal-oxidized in the order. Then the single or double-layered antiferromagnetic layer shown below was formed as the pinning layer 13, and a Ta layer (3.0 nm) was formed as the cap protection layer 14. The pinning layers 13 were prepared as follows: (1) a double-layered film in which a $Co_{90}Fe_{10}$ layer (1.0 nm) is used as the exchange coupling giving layer 13a and a $Co_{30}Fe_{70}$ layer (1.1 nm) is used as the exchange coupling enhancement layer 13b, (2) a $Co_{90}Fe_{10}$ single layer film (2.5 nm), (3) $Ni_{80}Fe_{20}$ single layer film (4.8 nm), and (4) $Co_{30}Fe_{70}$ single layer film (2.1 nm). These exchange coupling films were annealed at a temperature of 250° C. for one hour while the magnetic field strength of about 3 KOe is applied to the exchange coupling films in the same magnetic field applying direction as during deposition. The exchange coupling magnetic field $H_{ex}$ and the coercive force $H_{cp}$ of the pinning layer were measured by a vibrating sample magnetometer (VSM). Each film thickness was adjusted so that the magnetization of the double-layered film of (1), namely the sum of the magnetization of the exchange coupling giving layer and the magnetization of the exchange coupling enhancement layer, and each magnetization of (2), (3), and (4) are entirely equal. Table 1 shows a measurement result of the exchange coupling magnetic field $H_{ex}$ and the coercive force $H_{cp}$. Table 1 also shows the exchange coupling energy J which is calculated by the exchange coupling magnetic field $H_{ex}$ of each pinning layer, the magnetization $M_s$, and the film thickness t according to Formula 1. The exchange coupling films described in (1) to (4) are represented as Nos. 1 to 4 in Table 1 respectively. The same representation is applicable to following experiments. In the table 1, for example, "$Co_{90}Fe_{10}$ (1.0 nm)/$Co_{30}Fe_{70}$ (1.1 nm)" in No. 1 means "$Co_{90}Fe_{10}$ layer (1.0 nm)/$Co_{30}Fe_{70}$ layer (1.1 nm)". The same is true for other examples and comparative examples in table 1 and other tables.

TABLE 1

| | No. | Configuration of pinning layer | $H_{ex}$ (Oe) | $H_{cp}$ (Oe) | J ($\times 10^{-7}$ J/cm$^2$) |
|---|---|---|---|---|---|
| Example | 1 | $Co_{90}Fe_{10}$ (1.0 nm)/$Co_{30}Fe_{70}$ (1.1 nm) | 953 | 99 | 0.352 |
| Comparative example | 2 | $Co_{90}Fe_{10}$ (2.5 nm) | 400 | 84 | 0.150 |
| Comparative example | 3 | $Ni_{80}Fe_{20}$ (4.8 nm) | 234 | 59 | 0.088 |
| Comparative example | 4 | $Co_{30}Fe_{70}$ (2.1 nm) | 594 | 208 | 0.248 |

No. 1 shown in Table 1 is the example of the invention. Nos. 2 to 4 are the comparative examples. As can be seen from Table 1, the exchange coupling magnetic field $H_{ex}$ of the example No. 1 can be increased much larger than that of the comparative examples Nos. 2 to 4 in a manner that the pinning layer is divided into two layers of the exchange coupling giving layer and the exchange coupling enhancement layer. The double-layered pinning layer is particularly characterized in that the exchange coupling energy J of two ferromagnetic layers constituting the double-layered pinning layer is larger than that of the single layers. If the exchange coupling is to follow a conventional thinking that the exchange coupling is decided by the ferromagnetic material being in contact with the antiferromagnetic material, since the exchange coupling is decided by the $Co_{90}Fe_{10}$ layer in the example No. 1, the exchange coupling energy J of the pinning layer in the example No. 1 and the pinning layer in the comparative example No. 2 should be equal, however actually the exchange coupling energy J of the example No.

1 increases more than double of the comparative example No. 2 by the double-layered pinning layer. It is found that remarkable effect, which the exchange coupling energy (namely, exchange coupling magnetic field) can be extremely increased, was obtained without increasing the coercive force of the pinning layer in a manner that the pinning layer is formed by the double-layered configuration including the exchange coupling giving layer and the exchange coupling enhancement layer. The exchange coupling energy generated by the combination of the IrMn antiferromagnetic layer and the pinning layer of the example No. 1 is as large as the exchange coupling energy which is reported in the exchange coupling film formed by the antiferromagnetic material of the ordered alloy such as PtMn or NiMn. The comparative example No. 4 is a case that the pinning layer is formed only by the exchange coupling enhancement layer. Though the exchange coupling energy J in the comparative example No. 4 became larger compared with the comparative example No. 2 whose pinning layer is formed only by the exchange coupling giving layer of $Co_{90}Fe_{10}$, the coercive force $H_{cp}$ of the pinning layer became more than double of the example No. 1.

(Second Experiment)

A second experiment will be described. The exchange coupling film of the second experiment is the exchange coupling film having the Top-AF type of configuration shown in FIG. 3. The exchange coupling film having the double-layered pinning layer whose pinning layer 13 includes the exchange coupling giving layer 13a and the exchange coupling enhancement layer 13b of the invention was produced as the experiment, the exchange coupling film having the conventional single-layered pinning layer was also produced for comparison. Concretely, a Ta layer (1.5 nm) as the foundation layer 11a, a NiFe layer (2.0 nm) as the foundation layer 11b, the single or double-layered antiferromagnetic layer shown below as the pinning layer 13, an IrMn layer (10 nm) as the antiferromagnetic layer 12, and a Ta layer (3.0 nm) as the cap protection layer 14 were formed on the silicon substrate 10 whose surface was thermal-oxidized in the order. The pinning layers 13 were prepared as follows: (5) a double-layered film in which a $Co_{90}Fe_{10}$ layer (1.0 nm) is used as the exchange coupling giving layer 13a and a $Co_{30}Fe_{70}$ layer (1.1 nm) is used as the exchange coupling enhancement layer 13b, (6) a $Co_{90}Fe_{10}$ single layer film (2.5 nm), (7) $Ni_{60}Fe_{20}$ single layer film (4.8 nm), and (8) $Co_{30}Fe_{70}$ single layer film (2.1 nm). These exchange coupling films were annealed at a temperature of 250° C. for one hour while the magnetic field strength of about 3 KOe is applied to the exchange coupling films in the same magnetic field applying direction as during deposition. The exchange coupling magnetic field $H_{ex}$ and the coercive force $H_{cp}$ of the pinning layer were measured by the vibrating sample magnetometer (VSM). In the same way as the first experiment, the magnetization of the double-layered film of (5), namely the sum of the magnetization of the exchange coupling giving layer and the magnetization of the exchange coupling enhancement layer, and each magnetization of (6), (7), and (8) are entirely equal. Table 2 shows a measurement result of the exchange coupling magnetic field $H_{ex}$ and the coercive force $H_{cp}$. Table 2 also shows the exchange coupling energy J which is calculated by the exchange coupling magnetic field $H_{ex}$ of each pinning layer, the magnetization $M_s$, and the film thickness t according to Formula 1.

TABLE 2

|  | No. | Configuration of pinning layer | $H_{ex}$ (Oe) | $H_{cp}$ (Oe) | J ($\times 10^{-7}$ J/cm$^2$) |
|---|---|---|---|---|---|
| Example | 5 | $Co_{30}Fe_{70}$ (1.1 nm)/ $Co_{90}Fe_{10}$ (1.0 nm) | 820 | 83 | 0.307 |
| Comparative example | 6 | $Co_{90}Fe_{10}$ (2.5 nm) | 365 | 74 | 0.137 |
| Comparative example | 7 | $Ni_{80}Fe_{20}$ (4.8 nm) | 230 | 47 | 0.086 |
| Comparative example | 8 | $Co_{30}Fe_{70}$ (2.1 nm) | 512 | 195 | 0.192 |

No. 5 shown in Table 2 is the example of the Top-AF type of exchange coupling film of the invention. Since the example No. 5 has the double-layered pinning layer including the exchange coupling giving layer and the exchange coupling enhancement layer, though the exchange coupling energy became somewhat smaller compared with the example No. 1 of the Bottom-AF type of exchange coupling film, the exchange coupling magnetic field $H_{ex}$ of the example No. 5 was able to be much larger than that of the single-layered pinning layer. In the same way as the example No. 1 shown in Table 1, while maintaining the small coercive force of the pinning layer, the exchange coupling energy (namely, exchange coupling magnetic field) of the example No. 5 was able to be remarkably increased compared with the single-layered pinning layer. On the other hand, Nos. 6 to 8 shown in Table 2 are the comparative examples. Because the pinning layer of the comparative examples Nos. 6 to 8 was the single layer, the exchange coupling energy was small.

(Third Experiment)

A third experiment will be explained. It is a purpose of the third experiment to study an effect which a combination of the exchange coupling giving layer and the exchange coupling enhancement layer affects the exchange coupling. The exchange coupling film of the third experiment is the Bottom-AF type of exchange coupling film shown in FIG. 2. A Ta layer (5 nm) as the foundation layer 11a, a Cu layer (3 nm) as the foundation layer 11b, an IrMn layer (10 nm) as the antiferromagnetic layer 12, a ferromagnetic layer of combinations shown below as the exchange coupling giving layer 13a and the exchange coupling enhancement layer 13b, and a Ta layer (5 nm) as the cap protection layer 14 were formed on the silicon substrate 10 whose surface was thermal-oxidized in the order to produce the exchange coupling film of the double layered pinning layer. The combination of exchange coupling giving layer 13a/ exchange coupling enhancement layer 13b were prepared as follows: (11) $Co_{90}Fe_{10}$ layer (1.0 nm)/$Co_{30}Fe_{70}$ layer (1.1 nm), (12) $Co_{90}Fe_{10}$ layer (0.5 nm)/$Co_{30}Fe_{70}$ layer (1.5 nm), (13) $Co_{90}Fe_{10}$ layer (1.0 nm)/$Ni_{80}Fe_{20}$ layer (2.9 nm), and (14) $Ni_{80}Fe_{20}$ layer (1.0 nm)/$Co_{30}Fe_{70}$ layer (1.5 nm). These exchange coupling films were annealed at a temperature of 250° C. for one hour while the magnetic field strength of about 3 KOe is applied to the exchange coupling films in the same magnetic field applying direction as during deposition. The exchange coupling magnetic field $H_{ex}$ and the coercive force $H_{cp}$ of the pinning layer were measured by the vibrating sample magnetometer (VSM). Each film thickness was adjusted so that each magnetization of the double-layered pinning layers, namely the sum of the magnetization of the exchange coupling giving layer and the magnetization of the exchange coupling enhancement layer, is entirely equal. The result is shown in Table 3.

TABLE 3

| No. | Configuration of pinning layer | $H_{ex}$ (Oe) | $H_{cp}$ (Oe) | J (×10⁻⁷ J/cm²) |
|---|---|---|---|---|
| Example 11 | $Co_{90}Fe_{10}$ (1.0 nm)/ $Co_{30}Fe_{70}$ (1.1 nm) | 1160 | 200 | 0.427 |
| Example 12 | $Co_{90}Fe_{10}$ (0.5 nm)/ $Co_{30}Fe_{70}$ (1.5 nm) | 1360 | 280 | 0.508 |
| Comparative example 13 | $Co_{90}Fe_{10}$ (1.0 nm)/ $Ni_{80}Fe_{20}$ (2.9 nm) | 335 | 75 | 0.126 |
| Comparative example 14 | $Ni_{80}Fe_{20}$ (1.0 nm)/ $Co_{30}Fe_{70}$ (1.5 nm) | 210 | 105 | 0.079 |

Nos. 11 and 12 shown in Table 3 are the examples of the invention, Nos. 13 and 14 are the comparative examples. Though the example No. 11 and the example No. 1 shown in Table 1 have the same configuration of the pinning layer 13, the foundation layer 11b of the antiferromagnetic layer 12 including IrMn is different from each other, it is supposed that the difference of the antiferromagnetic layer becomes the difference of the exchange coupling energy. When the foundation layer of the antiferromagnetic material (IrMn) layer 12 is made of Cu, the exchange coupling energy became larger compared with the foundation layer made of NiFe.

In case that the combination of exchange coupling giving layer/exchange coupling enhancement layer is $Co_{90}Fe_{10}$ layer/$Co_{30}Fe_{70}$ layer, as can be seen from comparison of the example Nos. 11 and 12 shown in Table 3, the remarkably large exchange coupling such as the exchange coupling energy J of about 0.5×10⁻⁷ J/cm² was able to be realized by adjusting each film thickness. In this case, since the exchange coupling magnetic field is quite large while the coercive force of the pinning layer becomes large, the antiparallel range between the magnetic moment of the free layer and that of the pinning layer can be secured sufficiently wide in the GMR or TMR type of magneto-resistance effect device using the exchange coupling film as the magnetization fixing layer, which results in no influence on spin valve operation. This permitted the magneto-resistance effect device having quite excellent stability of operation to be provided.

In the pinning layer including the exchange coupling giving layer 13a made of $Co_{90}Fe_{10}$ and the exchange coupling enhancement layer 13b made of $Ni_{80}Fe_{20}$ shown in the comparative example No. 13 and the pinning layer including the exchange coupling giving layer 13a made of $Ni_{80}Fe_{20}$ and the exchange coupling enhancement layer 13b made of $Co_{30}Fe_{70}$ shown in the comparative example No. 14, the exchange coupling energy, namely the exchange coupling magnetic field was remarkably decreased. That is to say, it is found that NiFe does not function as the exchange coupling giving layer and the exchange coupling enhancement layer.

(Fourth Experiment)

As described above, in order to increase the exchange coupling in the double-layered pinning layer, it was found that the combination of the exchange coupling giving layer and the exchange coupling enhancement layer is important and NiFe is not preferable to the exchange coupling giving layer and the exchange coupling enhancement layer. In the fourth experiment, a combination in which the large exchange coupling can be obtained by a CoFe alloy was studied.

The exchange coupling film of the fourth experiment is the exchange coupling film having the Bottom-AF type of configuration shown in FIG. 2. A Ta layer (5 nm) as the foundation layer 11a, a Cu layer (3 nm) as the foundation layer 11b, an IrMn layer (10 nm) as the antiferromagnetic layer 12, a ferromagnetic layer of combinations shown below as the exchange coupling giving layer 13a and the exchange coupling enhancement layer 13b, and a Ta layer (5 nm) as the cap protection layer 14 were formed on the silicon substrate 10 whose surface was thermal-oxidized in the order to produce the exchange coupling film of the double layered pinning layer. The combination of exchange coupling giving layer 13a/exchange coupling enhancement layer 13b were prepared as follows: (21) $Co_{90}Fe_{10}$ (1.0 nm)/Fe (1.3 nm), (22) $Co_{90}Fe_{10}$ (1.0 nm)/$Co_{50}Fe_{50}$ (1.2 nm), (23) $Co_{90}Fe_{10}$ (1.0 nm)/$Co_{70}Fe_{30}$ (1.3 nm), (24) $Co_{90}Fe_{10}$ (1.0 nm)/Co (1.6 nm), (25) Fe (0.9 nm)/$Co_{30}Fe_{70}$ (1.1 nm), (26) $Co_{50}Fe_{50}$ (0.8 nm)/$Co_{30}Fe_{70}$ (1.1 nm), (27) $Co_{70}Fe_{30}$ (0.9 nm)/$Co_{30}Fe_{70}$ (1.1 nm), and (28) Co (1.1 nm)/$Co_{30}Fe_{70}$ (1.1 nm). These exchange coupling films were annealed at a temperature of 250° C. for one hour while the magnetic field strength of about 3 KOe is applied to the exchange coupling films in the same magnetic field applying direction as during deposition. The exchange coupling magnetic field $H_{ex}$ and the coercive force $H_{cp}$ of the pinning layer were measured by the vibrating sample magnetometer (VSM). Each film thickness was adjusted so that each magnetization of the double-layered pinning layers, namely the sum of the magnetization of the exchange coupling giving layer and the magnetization of the exchange coupling enhancement layer, is entirely equal. The result is shown in Table 4. Table 4 also shows the exchange coupling energy J which is calculated by the exchange coupling magnetic field $H_{ex}$ of each pinning layer, the magnetization $M_s$, and the film thickness t according to Formula 1.

TABLE 4

| No. | Configuration of pinning layer | $H_{ex}$ (Oe) | $H_{cp}$ (Oe) | J (×10⁻⁷ J/cm²) |
|---|---|---|---|---|
| Example 21 | $Co_{90}Fe_{10}$ (1.0 nm)/ Fe (1.3 nm) | 1080 | 175 | 0.405 |
| Example 22 | $Co_{90}Fe_{10}$ (1.0 nm)/ $Co_{50}Fe_{50}$ (1.2 nm) | 1240 | 270 | 0.460 |
| Example 23 | $Co_{90}Fe_{10}$ (1.0 nm)/ $Co_{70}Fe_{30}$ (1.3 nm) | 1125 | 145 | 0.422 |
| Comparative example 24 | $Co_{90}Fe_{10}$ (1.0 nm)/ Co (1.6 nm) | 320 | 70 | 0.120 |
| Comparative example 25 | Fe (0.9 nm)/ $Co_{30}Fe_{70}$ (1.1 nm) | 285 | 295 | 0.106 |
| Comparative example 26 | $Co_{50}Fe_{50}$ (0.8 nm)/ $Co_{30}Fe_{70}$ (1.1 nm) | 320 | 280 | 0.120 |
| Comparative example 27 | $Co_{70}Fe_{30}$ (0.9 nm)/ $Co_{30}Fe_{70}$ (1.1 nm) | 450 | 305 | 0.168 |
| Example 28 | Co (1.1 nm)/ $Co_{30}Fe_{70}$ (1.1 nm) | 1115 | 104 | 0.418 |

Nos. 21 to 23 shown in Table 4 are the examples of the invention. The examples Nos. 21 to 23 are the example that the exchange coupling giving layer 13a is fixed by the $Co_{90}Fe_{10}$ layer (1.0 nm) and composition of the CoFe layer of the exchange coupling enhancement layer 13b is varied, the exchange coupling enhancement layer 13b is made of Fe or the CoFe alloy having the body-centered cubic structure except Co. It is found that examples Nos. 21 to 23 have compatibility of the larger exchange coupling energy and the smaller coercive force of the pinning layer. When the composition of the CoFe alloy is represented as $Co_{100-Y}Fe_Y$, the stable body-centered cubic structure exists in a range of $25 \leq Y < 100$ (at %).

On the other hand, No. 24 is a comparative example. Because the exchange coupling enhancement layer 13b in the comparative example No. 24 is made of Co, the exchange coupling magnetic field $H_{ex}$ was small.

Nos. 25 to 27 shown in Table 4 are comparative examples, No. 28 is an example. As shown in the comparative examples Nos. 25 to 27, in case that the exchange coupling enhancement layer 13b is fixed by the $Co_{30}Fe_{70}$ layer (1.1 nm) and composition of the CoFe layer of the exchange coupling giving layer 13a is varied, the exchange coupling energy was small and the coercive force of the pinning layer was large within an area where the exchange coupling giving layer was made of Fe or the CoFe alloy having the body-centered cubic structure except Co. Since the exchange coupling giving layer 13a in the example No. 28 is made of Co, the example No. 28 had compatibility of the larger exchange coupling energy and the smaller coercive force of the pinning layer.

From the results of the experiments shown in Tables 1 and 4, it is found that the exchange coupling films have compatibility of the larger exchange coupling energy and the smaller coercive force of the pinning layer, in case that the exchange coupling giving layer is made of Co or the CoFe alloy of the face-centered cubic structure. When the composition of the CoFe alloy is represented as $Co_{100-X}Fe_X$, the stable face-centered cubic structure exists in a range of $0 \leq X < 25$ (at %).

(Fifth Experiment)

A fifth experiment will be explained below. The fifth experiment is concerning the exchange coupling film using an amorphous ferromagnetic material including mainly the CoFe alloy as the exchange coupling giving layer. The exchange coupling film of the fifth experiment is the exchange coupling film having the Bottom-AF type of configuration shown in FIG. 2. A Ta layer (5 nm) as the foundation layer 11a, a Cu layer (3 nm) as the foundation layer 11b, an IrMn layer (10 nm) as the antiferromagnetic layer 12, a ferromagnetic layer of combinations shown below as the exchange coupling giving layer 13a and the exchange coupling enhancement layer 13b, and a Ta layer (5 nm) as the cap protection layer 14 were formed on the silicon substrate 10 whose surface was thermal-oxidized in the order to produce the exchange coupling film of the double-layered pinning layer. The combination of exchange coupling giving layer 13a/exchange coupling enhancement layer 13b were prepared as follows: (31) $Co_{74}Fe_6B_{20}$ (1.2 nm) layer/Fe layer (1.3 nm), (32) $CO_{67}Fe_5Si_{10}B_{18}$ layer (4.0 nm)/$Co_{30}Fe_{70}$ layer (1.1 nm), (33) $Co_{92}Zr_4Ta_4$ layer (1.3 nm)/$Co_{50}Fe_{50}$ layer (1.1 nm), (34) $Fe_{77.5}Si_{13.5}B_9$ layer (1.3 nm)/$Co_{30}Fe_{70}$ layer (1.1 nm), (35) $Fe85Si_{9.6}Al_{5.4}$ layer (1.0 nm)/$Co_{30}Fe_{70}$ layer (1.1 nm), (36) $Fe_{70}C_{30}$ layer (2.0 nm)/$Co_{50}Fe_{50}$ layer (1.1 nm), and (37) $Fe_{81}Ta_{7.5}C_{11.5}$ layer (0.8 nm)/$Co_{30}Fe_{70}$ layer (1.1 nm). These exchange coupling films were annealed at a temperature of 250° C. for one hour while the magnetic field strength of about 3 KOe is applied to the exchange coupling films in the same magnetic field applying direction as during deposition. The exchange coupling magnetic field $H_{ex}$ and the coercive force $H_{cp}$ of the pinning layer were measured by the vibrating sample magnetometer (VSM). Each film thickness was adjusted so that each magnetization of the double-layered pinning layers, namely the sum of the magnetization of the exchange coupling giving layer and the magnetization of the exchange coupling enhancement layer, is entirely equal. The result is shown in Table 5.

TABLE 5

| | No. | Configuration of pinning layer | $H_{ex}$ (Oe) | $H_{cp}$ (Oe) | J ($\times 10^{-7}$ J/cm$^2$) |
|---|---|---|---|---|---|
| Example | 31 | $Co_{74}Fe_6B_{20}$ (1.2 nm)/Fe (1.3 nm) | 1250 | 65 | 0.469 |
| Example | 32 | $Co_{67}Fe_5Si_{10}B_{18}$ (4.0 nm) / $Co_{30}Fe_{70}$ (1.1 nm) | 1140 | 60 | 0.428 |
| Example | 33 | $Co_{92}Zr_4Ta_4$ (1.3 nm)/$Co_{50}Fe_{50}$ (1.1 nm) | 1170 | 70 | 0.439 |
| Example | 34 | $Fe_{77.5}Si_{13.5}B_9$ (1.3 nm)/$Co_{30}Fe_{70}$ (1.1 nm) | 980 | 110 | 0.367 |
| Example | 35 | $Fe_{85}Si_{9.6}Al_{5.4}$ (1.0 nm) / $Co_{30}Fe_{70}$ (1.1 nm) | 1075 | 58 | 0.403 |
| Example | 36 | $Fe_{70}C_{30}$(2.0 nm)/$Co_{50}Fe_{50}$ (1.1 nm) | 950 | 150 | 0.356 |
| Example | 37 | $Fe_{81}Ta_{7.5}C_{11.5}$ (0.8 nm)/$Co_{30}Fe_{70}$ (1.1 nm) | 1030 | 185 | 0.386 |
| Comparative example | 38 | $Fe_{40}Ni_{40}B_{20}$ (1.8 nm)/$Co_{30}Fe_{70}$ (1.1 nm) | 250 | 80 | 0.092 |
| Comparative example | 39 | $Ni_{68}Si_{15}B_{17}$ (4.8 nm)/$Co_{30}Fe_{70}$ (1.1 nm) | 200 | 75 | 0.074 |

Nos. 31 to 37 shown in Table 5 are examples of the invention. Because the exchange coupling enhancement layer 13b was made of the Fe layer (1.3 nm), or the $Co_{30}Fe_{70}$ layer (1.1 nm) or the $Co_{50}Fe_{50}$ layer (1.1 nm) having the body-centered cubic structure and the exchange coupling giving layer 13a was made of the Co layer or the amorphous magnetic material layer including mainly Fe in the example Nos. 31 to 37, the exchange coupling energy was large and the coercive force of the pinning layer was small. On the contrary, in the comparative examples Nos. 38 and 39 in which the exchange coupling giving layer 13a is made of the amorphous magnetic material containing Ni, the exchange coupling energy was small, there was the obvious difference between the comparative examples Nos. 38 and 39 and the examples Nos. 31 to 37 whose exchange coupling giving layer 13a did not contain Ni. That is to say, it is thought that the magnetic material containing Ni does not function as the exchange coupling giving layer, whether the material is crystalline or amorphous.

(Sixth Experiment)

A sixth experiment which studied an effect of the antiferromagnetic layer combined with the double-layered pinning layer will be described. The exchange coupling film of the sixth experiment is the exchange coupling film having the Bottom-AF type of configuration shown in FIG. 2. A Ta layer (5 nm) as the foundation layer 11a, a NiFe layer (3 nm) as the foundation layer 11b, antiferromagnetic layers shown below as the antiferromagnetic layer 12, a $Co_{90}Fe_{10}$ layer (1.0 nm) as the exchange coupling giving layer 13a, a $Co_{30}Fe_{70}$ layer (1.1 nm) as the exchange coupling enhancement layer 13b, and a Ta layer (5 nm) as the cap protection layer 14 were formed in the order on the silicon substrate 10 whose surface was thermal-oxidized to produce the exchange coupling film of the double-layered pinning layer. The antiferromagnetic layers 12 were prepared as follows: (41) an IrMn layer (10 nm), (42) an FeMn layer (10 nm), (43) a RhMn layer (15 nm), (44) a PtMn layer (30 nm), (45) a NiMn layer (25 nm), (46) a NiO layer (30 nm), and (47) an $\alpha$-$Fe_2O_3$ layer (30 nm). The exchange coupling magnetic field $H_{ex}$ and the coercive force $H_{cp}$ of the pinning layer were measured by the vibrating sample magnetometer (VSM). Before the measurement, the examples of (41) to (43), (46), and (47) were annealed at a temperature of 250° C. for one hour while the magnetic field strength of about 3 KOe is applied to the exchange coupling films in the same magnetic field applying direction as during deposition, the examples of (44) and (45) were annealed at a temperature of 270° C. for five hours while the magnetic field strength of about 3 KOe is applied to the exchange coupling films in the same magnetic field applying direction as during deposition. The result is shown in Table 6.

TABLE 6

| | No. | Antiferromagnetic layer | $H_{ex}$ (Oe) | $H_{cp}$ (Oe) | J ($\times 10^{-7}$ J/cm$^2$) |
|---|---|---|---|---|---|
| Example | 41 | IrMn (10 nm) | 955 | 99 | 0.352 |
| Example | 42 | FeMn (10 nm) | 320 | 50 | 0.120 |
| Example | 43 | RhMn (15 nm) | 295 | 73 | 0.114 |
| Comparative example | 44 | PtMn (30 nm) | 855 | 880 | 0.321 |
| Comparative example | 45 | NiMn (25 nm) | 970 | 950 | 0.364 |
| Comparative example | 46 | NiO (30 nm) | 160 | 148 | 0.059 |
| Comparative example | 47 | α-Fe$_2$O$_3$ (30 nm) | 230 | 215 | 0.088 |

Nos. 41 to 43 shown in Table 6 are examples of the invention. Because the antiferromagnetic layer was formed by the disordered alloy in the examples Nos. 41 to 43, the large exchange coupling magnetic field $H_{ex}$ and the small coercive force $H_{cp}$ were able to be compatible. Particularly, in case that the antiferromagnetic layer of the IrMn layer (10 nm) shown in the example No. 41, the exchange coupling film had the large exchange coupling energy (namely, exchange coupling magnetic field) and the small coercive force. On the other hand, Nos. 44 to 47 are comparative examples. Because the antiferromagnetic layer in the comparative examples Nos. 44 to 47 was made of the ordered alloy type of antiferromagnetic material such as PtMn and NiMn, though the exchange coupling energy was large, the coercive force of the pinning layer became extremely large. In the spin valve type of GMR or TMR magneto-resistance effect device using the exchange coupling film as the magnetization fixing layer, the pinning layer rotates simultaneously with the rotation of the free layer, which results in a problem of stable operation.

(Seventh Experiment)

An experiment of the GMR type of magneto-resistance effect device utilizing the above-described exchange coupling film will be described below. In the spin valve type of magneto-resistance effect device including antiferromagnetic layer/pinning layer/nonmagnetic layer/free layer, the magneto-resistance effect device of the seventh experiment is the GMR type of magneto-resistance effect device in which the exchange coupling film including antiferromagnetic layer/exchange coupling giving layer/exchange coupling enhancement layer is used as the exchange coupling film of antiferromagnetic layer/pinning layer and the nonmagnetic layer is made of Cu. Since there is no difference in the basic operation of the magneto-resistance effect device, whether the Bottom-AF type in which antiferromagnetic layer/pinning layer is located under Cu or the Top-AF type in which antiferromagnetic layer/pinning layer is located on Cu, the Top-AF type of GMR magneto-resistance effect device will be described in the seventh experiment.

The GMR type of magneto-resistance effect device having the configuration shown in FIG. 5 is produced as the example No. 51. By using the sputtering apparatus described above, the foundation layer 21a including a Ta layer of 3 nm in thickness, the foundation layer 21b including a Pt layer of 10 nm in thickness, the free layer 25 including a Ni$_{80}$Fe$_{20}$ layer of 2 nm in thickness and a Co$_{90}$Fe$_{10}$ of 1 nm in thickness, the nonmagnetic layer 24 including a Cu layer of 2.5 nm in thickness, the exchange coupling enhancement layer 23b including a Co$_{30}$Fe$_{70}$ layer of 1.1 nm in thickness, the exchange coupling giving layer 23a including a Co$_{90}$Fe$_{10}$ layer of 1 nm in thickness, the antiferromagnetic layer 22 including a IrMn layer of 10 nm in thickness, and the cap protection layer 26 including a Ta layer of 10 nm in thickness were formed in the order on the silicon substrate 20 whose surface was thermal-oxidized. The magneto-resistance effect device was annealed at a temperature of 250° C. for 30 minutes while the magnetic field strength of about 3 KOe is applied to the exchange coupling films in the same magnetic field applying direction as during deposition.

Then the magneto-resistance effect device was processed by photolithography and ion milling to form the Au electrodes 27 of 50 nm in thickness with which current could be flown into the device. The magnetic resistance of the finished magneto-resistance effect device was measured by a four-probes method. In the formation of the device, a rectangular pattern for magnetization measurement having a 10 mm long and a 10 mm width was formed to measure the magnetic characteristics of the magneto-resistance effect device by using the vibrating sample magnetometer (VSM).

The magneto-resistance effect device having the single-layered pinning layers 23, which were biased by the antiferromagnetic layer 22 made of an IrMn layer, were prepared as the comparative example: (52) a Co$_{90}$Fe$_{10}$ layer of 2.5 nm in thickness, (53) a Ni$_{80}$Fe$_{20}$ layer of 4.8 nm in thickness, and (54) a Co$_{30}$Fe$_{70}$ layer of 2.1 nm in thickness. In the comparative examples Nos. 52 to 54, the configuration except the pinning layer 23 was the same as the example No. 51. The magnetization of each pinning layer 23 was adjusted so as to be equal to the magnetization (product of saturation magnetization and film thickness, namely 4.71 Tesla·nm) corresponding to the Co$_{90}$Fe$_{10}$ layer of 2.5 nm in thickness.

Figure 11:
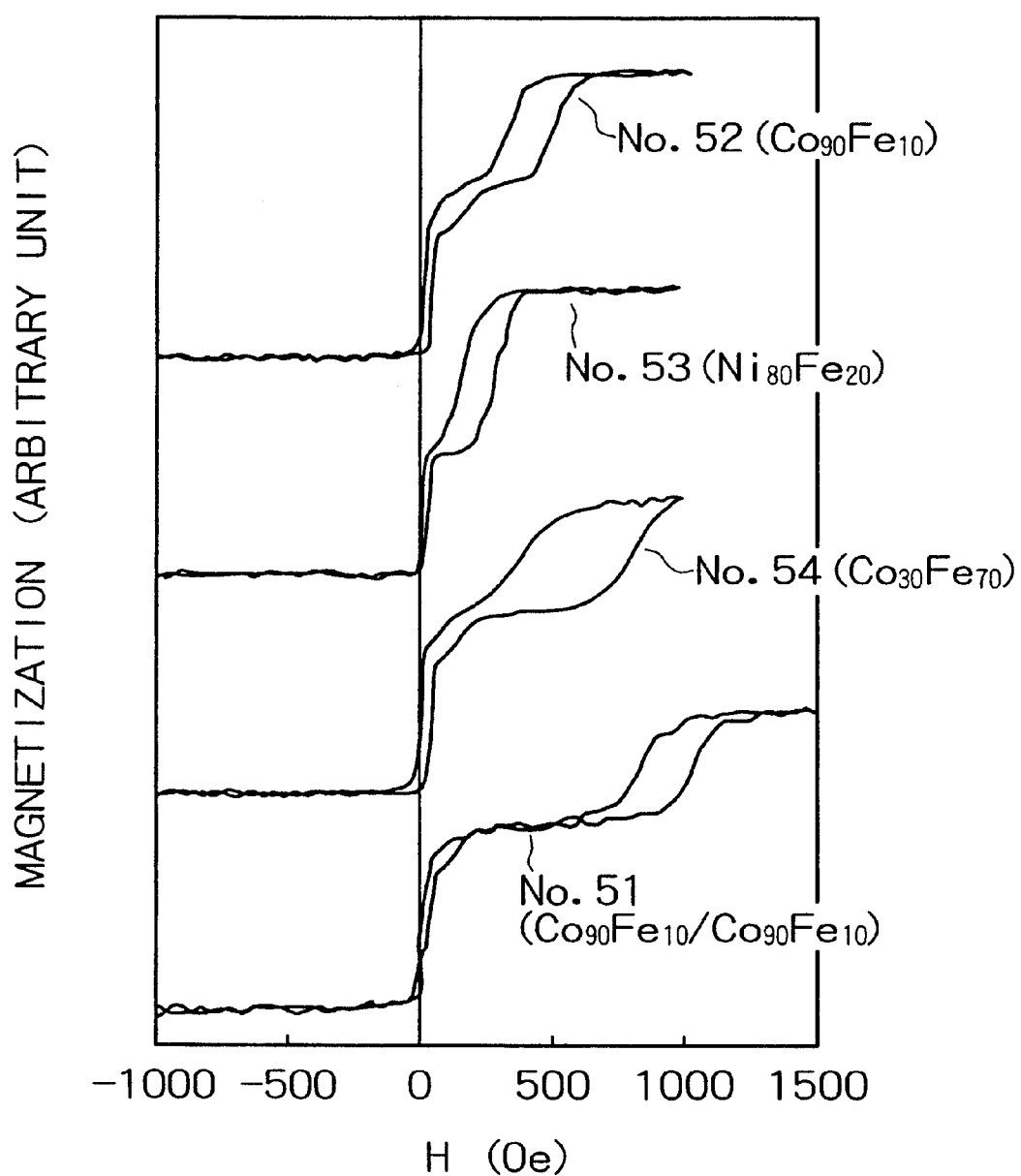
FIG. 11 is a graph showing magnetization curves of an example and comparative examples of a seventh experiment, where transverse axis is magnetic field strength and longitudinal axis is intensity of magnetization.

FIG. 11 is a graph showing magnetization curves of the experiment and the comparative examples of the seventh experiment, where transverse axis is magnetic field strength and longitudinal axis is intensity of magnetization. Since the magnetization of each pinning layer 23 was adjusted to be equal to 4.71 Tesla·nm, a degree of the exchange coupling bias was directly reflected in a variation from the origin. As can be seen from FIG. 11, because the magneto-resistance effect device of the invention, in which the pinning layer is divided into two layers, the Co$_{90}$Fe$_{10}$ layer is used as the exchange coupling giving layer, and the Co$_{30}$Fe$_{70}$ layer is used as the exchange coupling enhancement layer, had the large exchange coupling magnetic field and the small coercive force of the hysteresis of the pinning layer, compared with the magneto-resistance effect device of the single layered pinning layer of the comparative examples, the hysteresis of the free layer was clearly separated from that of the pinning layer. Accordingly, the antiparallel state between the magnetization of the free layer and that of the pinning layer was realized even though the external magnetic field was 500 Oe. In case of the single layered pinning layer of the comparative examples, the separation of the hysteresis of the free layer from that of the pinning layer was small because of the small exchange coupling magnetic field or the large coercive force of the pinning layer, so that the comparative examples were obviously worse than the double-layered pinning layer on a point of stable operation of the magneto-resistance effect device.

Table 7 shows the rate of change of the magnetic resistance (MR ratio) regarding the magneto-resistance effect devices of the example and the comparative example. As shown in Table 7, each magnetic resistance curve of the magneto-resistance effect devices corresponded well to each magnetization curve, it was observed that the pinning layer started to rotate with the rotation of the free layer in the single-layered pinning layer of the NiFe layer and the single-layered pinning layer of the $Co_{30}Fe_{70}$ layer of the comparative examples.

TABLE 7

| | No. | Configuration of pinning layer | Rate of change of magnetic resistance |
|---|---|---|---|
| Example | 51 | $Co_{90}Fe_{10}$ (1.0 nm)/ $Co_{30}Fe_{70}$ (1.1 nm) | 17% |
| Comparative example | 52 | $Co_{90}Fe_{10}$ (2.5 nm) | 18% |
| Comparative example | 53 | $Ni_{80}Fe_{20}$ (4.8 nm) | 12% |
| Comparative example | 54 | $Co_{30}Fe_{70}$ (2.1 nm) | 14% |

(Eighth Experiment)

An experiment of the TMR type of magneto-resistance effect device will be described below. In the spin valve type of magneto-resistance effect device including antiferromagnetic layer/pinning layer/nonmagnetic layer/free layer, the magneto-resistance effect device of the eighth experiment is the TMR type of magneto-resistance effect device in which the exchange coupling film including antiferromagnetic layer/exchange coupling giving layer/exchange coupling enhancement layer is used as the exchange coupling film of antiferromagnetic layer/pinning layer and the nonmagnetic layer is used as the tunnel barrier. The TMR type of magneto-resistance effect device having the Bottom-AF type of configuration whose antiferromagnetic layer/pinning layer is located under the tunnel barrier will be described in the experiment.

First, the TMR type of magneto-resistance effect device having the configuration shown in FIG. 6 was produced. By using the sputtering apparatus described above, the foundation layer 31a including a Ta layer of 3 nm in thickness, the foundation layer 31b including a Cu layer of 30 nm in thickness, the antiferromagnetic layer 32 including an IrMn layer of 10 nm in thickness, the exchange coupling giving layer 33a including a $Co_{90}Fe_{10}$ layer of 1.0 nm in thickness, and the exchange coupling enhancement layer 33b including a $Co_{30}Fe_{70}$ layer of 1.1 nm in thickness were formed in the order on the silicon substrate 30 whose surface was thermal-oxidized. An Al layer of 2 nm in thickness was formed on the exchange coupling enhancement layer 33b, the substrate 30 was conveyed to an oxidation treatment chamber, pure oxygen of 0.67 Pa in pressure was introduced into the oxidation treatment chamber, RF electric power of a 4 $mW/cm^2$ power was applied to generate oxygen plasma, and the tunnel barrier layer 34 was formed by the oxidation treatment for 30 seconds. Then the substrate conveyed to the sputtering chamber again, the free layer 35 including a $Ni_{80}Fe_{20}$ layer of 5 nm in thickness and the cap protection layer 36 including a Ta layer of 10 nm in thickness were formed. A multilayered body of the down side below the tunnel barrier layer 34, namely all the layers of the foundation layer 31a, the foundation layer 31b, the antiferromagnetic layer 32, the exchange coupling giving layer 33a, and the exchange coupling enhancement layer 33b are referred generally to as the lower electrode 39.

Then the junction device was formed by the photolithography and the ion milling. A photoresist film (not shown) covering a part of the cap protection layer 36 was formed, all the layers to the substrate 30 were processed by the ion milling. After removal of the photoresist, a junction resist pattern was formed on the lower electrode 39. A size of the junction resist pattern was about 1 $\mu$m long by 1 $\mu$m width to 20 $\mu$m long by 20 $\mu$m width. Then the junction resist pattern was processed by the ion milling to a surface of the lower electrode. Aluminum oxide of 200 nm in thickness was formed as the interlayer dielectric 38 with the junction resist remained. The junction resist was removed by lift-off to expose a film surface of the junction portion. The resist pattern in a shape of upper electrode was formed on the film surface of the junction portion, reverse sputtering cleaning by Ar plasma was done to the exposed junction surface, the Al upper electrode layer 39 was deposited. Finally the resist on the upper electrode was removed by the lift-off to finish the magneto-resistance effect device. This magneto-resistance effect device is the example No. 55. The magnetic resistance of the finished magneto-resistance effect device was measured by the four-probes method. In the formation of the device, a rectangular pattern for magnetization measurement having 10 mm long by 10 mm width was formed to measure the magnetic characteristics of the magneto-resistance effect device by the vibrating sample magnetometer (VSM).

The magneto-resistance effect device having the single-layered pinning layer 33 which was formed on the antiferromagnetic layer 32 made of an IrMn layer were prepared as the comparative example: (56) a $Co_{90}Fe_{10}$ layer of 2.5 nm in thickness, (57) a $Ni_{80}Fe_{20}$ layer of 4.8 nm in thickness, and (58) a $Co_{30}Fe_{70}$ layer of 2.1 nm in thickness. In the comparative examples Nos. 56 to 58, a configuration except the pinning layer 33 was the same as the example No. 55. The magnetization of each pinning layer 33 was adjusted so as to be equal to the magnetization (product of saturation magnetization and film thickness, namely 4.71 Tesla·nm) corresponding to the $Co_{90}Fe_{10}$ layer of 2.5 nm in thickness.

Because the TMR type of magneto-resistance effect devices of the example No. 55 and the comparative examples Nos. 56 to 58 in the eighth experiment use the exchange coupling film having the same configuration as the GMR type of magneto-resistance effect devices of the example No. 51 and the comparative examples Nos. 52 to 54 in the seventh experiment as the magnetization fixing layer respectively, there is no remarkable difference in behavior of the magnetization compared with the GMR type of magneto-resistance effect devices in the seventh experiment, almost the same magnetization curve as the magnetization curve shown in FIG. 11 was obtained. That is to say, the magneto-resistance effect device of the experiment, in which the pinning layer is divided into two layers, the exchange coupling giving layer 33a is made of $Co_{90}Fe_{10}$, and the exchange coupling enhancement layer 33b is made of $Co_{30}Fe_{70}$, had the large exchange coupling magnetic field and the small coercive force of the hysteresis of the pinning layer, compared with the magneto-resistance effect device of the comparative examples Nos. 56 to 58 in which the pinning layer is single layer, so that the hysteresis of the free layer was clearly separated from that of the pinning layer. On the other hand, in case of the single layered pinning layer of the comparative examples Nos. 56 to 58, the separation of the hysteresis of the free layer from that of the pinning layer was not large because of the small exchange coupling magnetic field or the large coercive force of the pinning layer, so that the comparative examples were obviously worse than the double-layered pinning layer on a point of stable operation of the magneto-resistance effect device.

Table 8 shows the rate of change of the magnetic resistance (MR ratio) regarding the TMR type of magneto-resistance effect devices of the example No. 55 and the comparative examples Nos. 56 to 58. As shown in Table 8, each magnetic resistance curve of the magneto-resistance effect devices corresponded well to each magnetization curve, behavior such that the magnetic moment of the pinning layer also started to rotate with the rotation of the magnetic moment of the free layer was observed in the single-layered pinning layer of the NiFe layer and the single-layered pinning layer of the $Co_{30}Fe_{70}$ layer of the comparative examples. The normalized junction resistance was almost equal to 250 K$\Omega\cdot\mu m^2$ in each junction device.

TABLE 8

| | No. | Configuration of pinning layer | Rate of change of magnetic resistance |
|---|---|---|---|
| Example | 55 | $Co_{90}Fe_{10}$ (1.0 nm)/ $Co_{30}Fe_{70}$ (1.1 nm) | 45% |
| Comparative example | 56 | $Co_{90}Fe_{10}$ (2.5 nm) | 35% |
| Comparative example | 57 | $Ni_{80}Fe_{20}$ (4.8 nm) | 37% |
| Comparative example | 58 | $Co_{30}Fe_{70}$ (2.1 nm) | 41% |

(Ninth Experiment)

The TMR type of magneto-resistance effect device having the Bottom-AF type of configuration was described in the eighth experiment, on the other hand, the TMR type of magneto-resistance effect device having the Top-AF type of configuration in which antiferromagnetic layer/pinning layer is located on the tunnel barrier layer will be described below.

First, the TMR type of magneto-resistance effect device having the configuration shown in FIG. 7 was produced. The substrate 30 was formed by ALTiC ($Al_2O_3$.TiC) on which a CoZrTa soft magnetic film of 1 $\mu$m in thickness was deposited beforehand, the foundation layer 31a including a Ta layer of 3 nm in thickness, the foundation layer 31b including a Pt layer of 3 nm in thickness, the free layer 35 including a $Ni_{80}Fe_{20}$ layer of 5 nm in thickness, and an Al layer of 0.7 nm in thickness were deposited in the order on the substrate 30, then the substrate 30 was conveyed to the oxidation treatment chamber, the tunnel barrier layer 34 was formed in a manner that a surface of the Al layer was exposed in pure oxygen of 1.3×10$^4$ Pa in pressure for 30 seconds to be naturally oxidized in situ. Then the substrate 30 conveyed to the sputtering chamber again, the exchange coupling enhancement layer 33b including a $Co_{30}Fe_{70}$ layer of 1.1 nm in thickness, the exchange coupling giving layer 33a including a $Co_{90}Fe_{10}$ layer of 1.0 nm in thickness, the antiferromagnetic layer 32 including an IrMn layer of 10 nm in thickness, and the cap protection layer 36 including a Ta layer of 10 nm in thickness were formed in the order on the tunnel barrier layer 34. A multilayered body of the down side below the tunnel barrier layer 34, namely all the layers of the foundation layer 31a, the foundation layer 31b, and the free layer 35 are referred generally to as the lower electrode 39.

Then, in the same way as the eighth experiment, the device was processed by the photoresist and the ion milling to finish the TMR type of magneto-resistance effect device. The normalized junction resistance of the TMR type of magneto-resistance effect device was 15 $\Omega\cdot\mu m^2$, the rate of change of the magnetic resistance was 9%.

Figure 12:
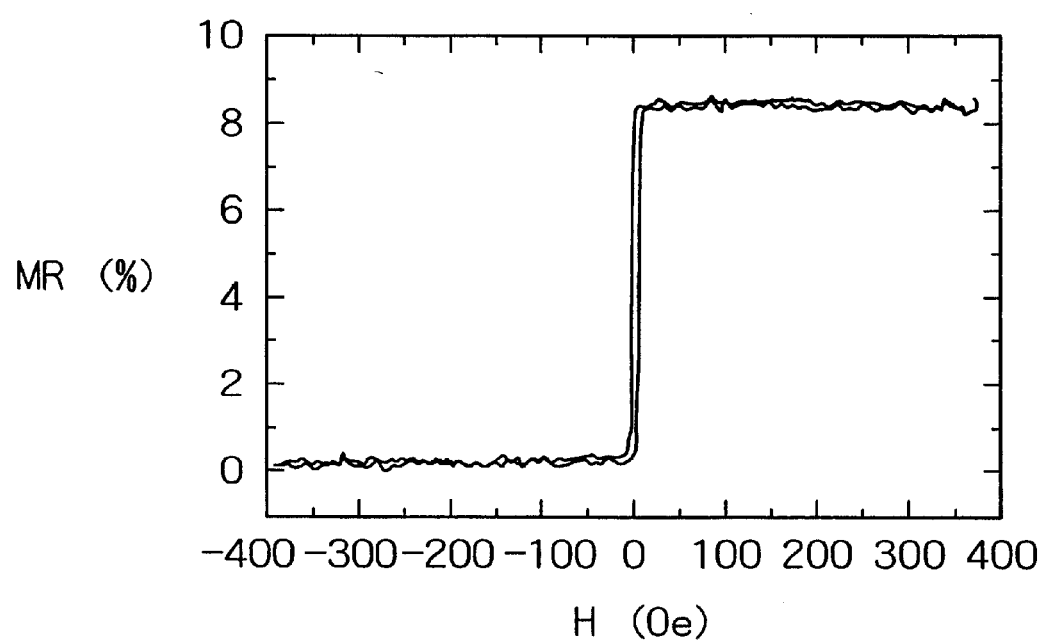
FIG. 12 is a graph showing a magnetic resistance curve of an example of a ninth experiment, where transverse axis is magnetic field strength and longitudinal axis is a rate of change of magnetic resistance.

FIG. 12 is a graph showing a magnetic resistance curve of the experiment, where transverse axis is the magnetic field strength and longitudinal axis is the rate of change of the magnetic resistance. As shown in FIG. 12, in the TMR type of magneto-resistance effect device of the experiment, the magnetizing direction of the pinning layer does not rotate within a range of magnetic field of ±400 Oe, it was confirmed that the device having extremely stable operation could be obtained.

(Tenth Experiment)

In a tenth experiment, the reproducing magnetic head was produced by using the GMR type of magneto-resistance effect device described in the seventh experiment. A cross-sectional view of the reproducing magnetic head of the experiment is the same as the cross-sectional view shown in FIG. 8. A lower shield layer 40 including CoZrTa of 1 $\mu$m in thickness, the insulating layer 41 including aluminum oxide of 0.1 $\mu$m in thickness, and the GMR type of magneto-resistance effect film 42 having the Top-AF type of configuration described in the seventh experiment were deposited in the order on the ALTiC ($Al_2O_3$.TiC) substrate.

The GMR type of magneto-resistance effect film 42 includes a Ta layer of 3 nm in thickness (first foundation layer), a Pt layer of 10 nm in thickness (second foundation layer), the free layer including a $Ni_{80}Fe_{20}$ layer of 2 nm in thickness and a $Co_{90}Fe_{10}$ layer of 1 nm in thickness, a Cu layer of 2.5 nm in thickness (nonmagnetic layer), a $Co_{30}Fe_{70}$ layer of 1.1 nm in thickness (exchange coupling enhancement layer), a $Co_{90}Fe_{10}$ layer of 1 nm in thickness (exchange coupling giving layer), and an IrMn layer of 10 nm in thickness (antiferromagnetic layer), and a Ta layer of 10 nm in thickness (cap protection layer).

After forming the device to become a trapezoid shape in a cross-section of the device portion through the process of the photolithography and the ion milling, the longitudinal bias layer 43 including a hard film of CoCrPtTa and the electrode 44 including a Cr/Au layer were deposited with the resist remained. Then, the resist which was remained on the device portion was removed by lift-off, the gap layer 45 made of aluminum oxide and the upper shield layer 46 made of CoZrTa were deposited to finish the reproducing magnetic head. When the finished magnetic head was tested, it showed good reproducing performance.

(Eleventh Experiment)

The reproducing magnetic head utilizing the TMR type of magneto-resistance effect device described in the ninth experiment will be described. A cross-sectional view of the reproducing magnetic head of the experiment is the same as the cross-sectional view shown in FIG. 9. After the lower shield layer 40 including a CoZrTa of 1 $\mu$m in thickness and the hard film 43 including CoCrPtTa were deposited on the ALTiC ($Al_2O_3$.TiC) substrate, as shown in FIG. 9, the hard film 43 was processed to form the longitudinal bias layer. The TMR type of magneto-resistance effect film 47 having the Top-AF type of configuration described in the ninth experiment was formed on a longitudinal bias pattern.

The TMR type of magneto-resistance effect film 47 includes a Ta layer of 3 nm in thickness (first foundation layer), a Pt layer of 3 nm in thickness (second foundation layer), the free layer including a $Ni_{80}Fe_{20}$ layer of 5 nm in thickness, the tunnel barrier layer which was formed in a manner that an Al layer of 0.7 nm in thickness was exposed in pure oxygen of 1.3×10$^4$ Pa in pressure for 30 seconds to be naturally oxidized in situ, a $Co_{30}Fe_{70}$ layer of 1.1 nm in thickness (exchange coupling enhancement layer), a $Co_{90}Fe_{10}$ layer of 1.0 nm in thickness (exchange coupling giving layer), and an IrMn layer of 10 nm in thickness (antiferromagnetic layer), and a Ta layer of 10 nm in thickness (cap protection layer).

Through the process of the photolithography and the ion milling, the device portion was processed as shown in FIG. 9, then the interlayer dielectric 48 was deposited with the resist remained. A CoZrTa layer of 1 μm in thickness was deposited as the upper shield layer 46 to finish the reproducing magnetic head. In the reproducing magnetic head utilizing the TMR type of magneto-resistance effect device, the upper and lower shields also have a function of the electrode. When the finished magnetic head was tested, it showed good reproducing performance.

(Twelfth Experiment)

A twelfth experiment will be described concerning the magnetic random access memory (MRAM) utilizing the TMR type of magneto-resistance effect devices having the Bottom-AF type of configuration described in the eighth experiment. A perspective view shown the MRAM produced in the experiment was the same as the perspective view shown in FIG. 10. The TMR type of magneto-resistance effect device 50 was formed between the bit line 51 and the word line 52. The TMR type of magneto-resistance effect devices 50 includes a Ta layer of 3 nm in thickness (first foundation layer), a NiFe layer of 2 nm in thickness (second foundation layer), an IrMn layer of 10 nm in thickness (antiferromagnetic layer 32), a $Co_{90}Fe_{10}$ layer of 1.0 nm in thickness (exchange coupling giving layer 33a), a $Co_{30}Fe_{70}$ layer of 1.1 nm in thickness (exchange coupling enhancement layer 33b), a tunnel barrier in which an Al layer of 2 nm in thickness was plasma-oxidized under condition that oxygen pressure was 0.67 Pa, RF electric power was 4 $mW/cm^2$, and oxidation time was 30 seconds, a $Ni_{80}Fe_{20}$ layer of 5 nm in thickness (free layer), and a Ta layer of 10 nm in thickness (cap protection layer). The bit line 51 and the word line 52 were made of Cu and Al respectively.

A junction area of the TMR type of magneto-resistance effect device of the MRAM produced by such a way was 2 μm by 1 μm, line widths of the bit line 51 and the word line 52 were 2 μm, and integration of the MRAM was 1 Kbits. It was confirmed that all bits in the MRAM of the experiment could be written and read normally.

What is claimed is:

1. An exchange coupling film comprising:
   an antiferromagnetic layer formed of a disordered alloy,
   an exchange coupling giving layer formed of a ferromagnetic material selected from the group consisting of Co and CoFe alloy having face-centered cubic structure, being in contact with said antiferromagnetic layer, and giving exchange coupling at an interface between said antiferromagnetic layer and said exchange coupling giving layer, and
   an exchange coupling enhancement layer formed of a ferromagnetic material selected from the group consisting of Fe and CoFe alloy having body-centered cubic structure and provided on said exchange coupling giving layer so that said exchange coupling giving layer is sandwiched between said antiferromagnetic layer and said exchange coupling enhancement layer, said exchange coupling enhancement layer amplifying said exchange coupling by said exchange coupling giving layer.

2. An exchange coupling film according to claim 1, wherein said disordered alloy is an IrMn alloy having the face-centered cubic structure.

3. An exchange coupling film comprising:
   an antiferromagnetic layer formed of a disordered alloy,
   an exchange coupling giving layer formed of an amorphous ferromagnetic material made of CoFe, being in contact with said antiferromagnetic layer, and giving exchange coupling at an interface between said antiferromagnetic layer and said exchange coupling giving layer, and
   an exchange coupling enhancement layer formed of a ferromagnetic material selected from the group consisting of Fe and CoFe alloy having body-centered cubic structure and provided on said exchange coupling giving layer so that said exchange coupling giving layer is sandwiched between said antiferromagnetic layer and said exchange coupling enhancement layer, said exchange coupling enhancement layer amplifying said exchange coupling by said exchange coupling giving layer.

4. An exchange coupling film according to claim 3, wherein said disordered alloy is an IrMn alloy having the face-centered cubic structure.

5. A magneto-resistance effect device comprising:
   a magnetization fixing layer in which a direction of magnetic moment is fixed,
   said magnetization fixing layer comprising:
     an antiferromagnetic layer formed of a disordered alloy,
     an exchange coupling giving layer formed of a ferromagnetic material selected from the group consisting of Co and CoFe alloy having face-centered cubic structure, being in contact with said antiferromagnetic layer, and giving exchange coupling at an interface between said antiferromagnetic layer and said exchange coupling giving layer, and
     an exchange coupling enhancement layer formed of a ferromagnetic material selected from the group consisting of Fe and CoFe alloy having body-centered cubic structure and provided on said exchange coupling giving layer so that said exchange coupling giving layer is sandwiched between said antiferromagnetic layer and said exchange coupling enhancement layer, said exchange coupling enhancement layer amplifying said exchange coupling by said exchange coupling giving layer,
   a free layer in which the direction of the magnetic moment is rotated by an external magnetic field, and
   a nonmagnetic layer provided between said magnetization fixing layer and said free layer.

6. A magneto-resistance effect device according to claim 5, wherein said disordered alloy is an IrMn alloy having the face-centered cubic structure.

7. A magneto-resistance effect device according to claim 5, wherein said nonmagnetic layer is made of Cu and is a giant magnetic resistance type of magneto-resistance effect device.

8. A magneto-resistance effect device according to claim 5, wherein said nonmagnetic layer includes a tunnel barrier insulator and is a tunnel magnetic resistance type of magneto-resistance effect device.

9. A magnetic head with a magneto-resistance effect device according to claim 5.

10. A magnetic random access memory with a magneto-resistance effect device according to claim 5.

11. A magneto-resistance effect device comprising:
    a magnetization fixing layer in which a direction of magnetic moment is fixed,
    said magnetization fixing layer comprising:
      an antiferromagnetic layer formed of a disordered alloy,
      an exchange coupling giving layer formed of an amorphous ferromagnetic material made of CoFe, being in contact with said antiferromagnetic layer, and giving exchange coupling at an interface between said antiferromagnetic layer and said exchange coupling giving layer, and an exchange coupling enhancement layer formed of a ferromagnetic material selected from the group consisting of Fe and CoFe alloy having body-centered cubic structure and provided on said exchange coupling giving layer so that said exchange coupling giving layer is sandwiched between said antiferromagnetic layer and said exchange coupling enhancement layer, said exchange coupling enhancement layer amplifying said exchange coupling by said exchange coupling giving layer.

a free layer in which the direction of the magnetic moment is rotated by an external magnetic field, and a nonmagnetic layer provided between said magnetization fixing layer and said free layer.

12. A magneto-resistance effect device according to claim 11, wherein said disordered alloy is an IrMn alloy having face-centered cubic structure.

13. A magnetic head with a magneto-resistance effect device according to claim 11.

14. A magnetic random access memory with a magneto-resistance effect device according to claim 11.

* * * * *